US006808951B2

(12) United States Patent
Ikeda et al.

(10) Patent No.: US 6,808,951 B2
(45) Date of Patent: Oct. 26, 2004

(54) SEMICONDUCTOR INTEGRATED CIRCUIT DEVICE AND MANUFACTURING METHOD THEREOF

(75) Inventors: Yoshihiro Ikeda, Hamura (JP); Tsutomu Okazaki, Ome (JP); Keisuke Tsukamoto, Ome (JP); Hiroshi Yanagita, Hamura (JP); Daisuke Okada, Kunitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/987,884

(22) Filed: Nov. 16, 2001

(65) Prior Publication Data

US 2002/0060332 A1 May 23, 2002

(30) Foreign Application Priority Data

Nov. 20, 2000 (JP) ........................................ 2000-353423

(51) Int. Cl.[7] ............................................... H01L 21/00
(52) U.S. Cl. ........................ 438/41; 438/187; 438/149
(58) Field of Search ........................... 438/41, 187, 149, 438/199, 253, 241, 228, 257, 305, 157, 195, 197, 585, 586, 637, 645, 670

(56) References Cited

U.S. PATENT DOCUMENTS

| 5,461,250 | A | * | 10/1995 | Burghartz et al. | .......... 257/347 |
| 5,927,992 | A | * | 7/1999 | Hodges et al. | .............. 438/439 |
| 5,946,548 | A | * | 8/1999 | Hashimoto et al. | ........... 438/41 |
| 6,037,207 | A | * | 3/2000 | Asano et al. | ................ 438/241 |
| 6,052,323 | A | * | 4/2000 | Kawamura | ................... 365/205 |
| 6,057,184 | A | * | 5/2000 | Brown et al. | ............... 438/199 |
| 6,097,068 | A | * | 8/2000 | Brown et al. | ............... 257/371 |
| 6,121,812 | A | * | 9/2000 | Tsukikawa | ................... 327/280 |
| 6,150,689 | A | * | 11/2000 | Narui et al. | ................ 257/306 |
| 6,168,985 | B1 | * | 1/2001 | Asano et al. | ............... 438/241 |
| 6,329,258 | B1 | * | 12/2001 | Inaba | ......................... 438/305 |
| 6,376,347 | B1 | * | 4/2002 | Ohmura et al. | ............ 438/585 |
| 6,387,744 | B2 | * | 5/2002 | Taniguchi et al. | .......... 438/228 |
| 6,417,045 | B1 | * | 7/2002 | Asano et al. | ................ 438/253 |
| 6,461,916 | B1 | * | 10/2002 | Adachi et al. | .............. 438/257 |
| 6,483,176 | B2 | * | 11/2002 | Noguchi et al. | ............ 257/666 |

FOREIGN PATENT DOCUMENTS

| JP | 9-252098 | 9/1997 |
| JP | 10-289951 | 10/1998 |
| JP | 11-26574 | 1/1999 |

* cited by examiner

*Primary Examiner*—Carl Whitehead, Jr.
*Assistant Examiner*—Laura M Schillinger
(74) *Attorney, Agent, or Firm*—Miles & Stockbridge P.C.

(57) ABSTRACT

An insulating film for protecting an upper portion of a control gate electrode is constituted by a silicon oxide film, and thereby stress affecting a gate oxide film and a substrate that is located below a bottom portion thereof is reduced. Further, an etching prevention film consisting of a silicon nitride film is formed on a sidewall of the silicon oxide film, and thereby it is possible to prevent the sidewall of the silicon oxide film from being etched in a hydrofluoric acid cleaning step after processing of a gate electrode.

22 Claims, 35 Drawing Sheets

SEMICONDUCTOR INTEGRATED CIRCUIT DEVICE AND MANUFACTURING METHOD THEREOF

BACKGROUND OF THE INVENTION

The present invention relates to a semiconductor integrated circuit device and a manufacturing method thereof. The present invention particularly relates to a technique effectively applied to a semiconductor integrated circuit device including an electrically batch-erasable and rewritable nonvolatile semiconductor memory device (flash memory).

In a manufacturing process of a semiconductor integrated circuit device, when silicon oxide films deposited on a semiconductor substrate are etched to form contact holes, a means is taken to prevent a lower silicon oxide film exposed from each bottom portion of the contact holes, from being excessively etched. As the means, a technique is employed in which a silicon nitride film is provided between an upper layer and a lower layer of the silicon oxide films forming the contact holes, and only the upper layer of the silicon oxide films is etched by using the silicon nitride film as an etching stopper (as disclosed in, for example, Japanese Patent Laid-Open No. 11-26574, etc).

Also, in a manufacturing process of a recent mass storage DRAM (Dynamic Random Access Memory), when contact holes for connecting bit lines and capacitive elements to a semiconductor substrate are formed in spaces of gate electrodes fined, a self align contact (SAC) technique is employed (as disclosed by, for example, Japanese Patent Laid-Open No. 9-252098, etc.). The SAC technique forms the contact holes to be self-aligned to the spaces of the gate electrodes, by constituting an insulating film (referred to as a cap insulating film, a protection insulating film or the like) covering upper portions of the gate electrodes and an insulating film (sidewall insulating film) covering sidewalls of the gate electrodes by silicon nitride films, and by utilizing etching rate difference between the silicon oxide films and the silicon nitride films.

Further, in recent years, the above-mentioned SAC technique has gradually been employed in manufacturing processes of semiconductor memories other than the DRAM. For example, Japanese Patent Laid-Open No. 10-289951 discloses an invention in which the SAC technique is applied to a manufacturing process of an EEPROM (electrically erasable programmable read-only memory).

SUMMARY OF THE INVENTION

As a type among flash memories, there is known an NOR type flash memory. Each memory cell of the NOR type flash memory is provided between a gate oxide film and a control gate electrode (word line) located on an upper portion thereof, and is constituted by a so-called floating gate type MISFET (Metal Insulator Semiconductor Field Effect Transistor) in which a floating gate electrode electrically insulated from the periphery thereof is used as a charge accumulation region. A floating gate type MISFET can relatively reduce a memory size since a control gate electrode (word line) is laminated on an upper portion of a floating gate electrode formed through a thin gate insulating film formed on a main surface of a semiconductor substrate. It can be, therefore, said that the floating gate type MISFET has a memory cell structure suitable for realizing a mass storage.

In the case of the above-mentioned NOR type flash memory, there is a typical method for operation of being written into a memory cell. As the typical method, electrons are injected into the floating gate electrode, and threshold voltage (Vth) of a transistor by using a control gate electrode as a reference voltage is raised in comparison with a state in which no electrons thereof are accumulated. Injection of electrons into the floating gate electrode has, as typical methods, two systems. There is one system in which, by changing a channel current flowing in a source and drain channel to hot electrons in the vicinity of a drain, an electric field of the control gate electrode biased to have a positive voltage makes the hot electrons drown into the floating gate electrode. As another example, there is the other system in which, by a positive voltage applied to a control gate electrode, hot electrons generated by avalanche breakdown in the vicinity of a drain thereof are drown into a floating gate electrode. On the other hand, as a typical example of an erasing operation, there is utilized a system in which, by making electrons FN tunneling (Fowler-Nordheim tunneling) into a gate insulating film below a floating gate electrode, the electrons which are accumulated in the floating gate electrode, the electrons are discharged into the source or drain region of the semiconductor substrate.

Further, in the NOR type flash memory, memory cells are arranged in a lattice shape at respective intersections between predetermined number of word lines extending parallel to one direction and predetermined number of data lines extending parallel to a direction orthogonal to these word lines, the data lines are connected to drain regions of a MISFET constituting each memory cell, and source lines are connected to source regions thereof, respectively. Therefore, if each size of the memory cells is fined in order to make the NOR type flash memory mass storage, then the above-stated SAC technique is indispensable to formation of contact holes for connecting the data lines to the drain regions and that of contact holes for connecting the source lines to the source regions.

However, in the case where the SAC technique is introduced into flash memory manufacturing processes in order to form an insulating film protecting the upper portions of the control gate electrodes out of a silicon nitride film, a silicon nitride film over a control gate electrode gives high stress to a gate oxide film and a substrate of a lower portion thereof and causes crystal defects in the gate oxide film. As a result, it has become clear from consideration of the inventors of the present invention that there arises a problem peculiar to the floating gate type MISFET, the problem being one that charges accumulated in the floating gate electrode easily leak into the substrate.

Taking this disadvantage into account, the inventors of the present invention has considered realization of microfabrication memory cell using the SAC technique during suppression of the stress relative to the gate oxide film and the substrate of the lower portion thereof, by forming the protection insulating film over a control gate electrode by a silicon oxide film instead of a silicon nitride film or by a laminating film formed of a silicon oxide film and a silicon nitride film, and then by forming a sidewall insulating film by a silicon nitride film.

However, it has become clear that there arise the following problems of a MISFET manufacturing process in the case of forming the protection insulating film over the control gate electrode by a silicon oxide film. These problems will be described with reference to FIGS. 45 to 50.

To form a MISFET having two-layer gate structure consisting of a floating gate electrode and a control gate electrode, first, a polycrystalline silicon film 102A, an ONO film 103, a polycrystalline silicon film 104A, and a silicon oxide film 105 are sequentially deposited on a gate oxide film 101 formed on the main surface of a semiconductor substrate 100 in this order, as shown in FIG. 45. The polycrystalline silicon film 102A is used for a floating gate. The ONO film 103 consists of a silicon oxide film, a silicon nitride film and a silicon oxide film. The polycrystalline silicon film 104A is used for a control gate. The silicon oxide film 105 is served as a protection insulating film.

Next, as shown in FIG. 46, by using a photoresist film 106 as a mask, the silicon oxide film 105 is dry-etched. After the photoresist film 106 is removed, as shown in FIG. 47, the polycrystalline silicon film 104A, the ONO film 103 and the polycrystalline silicon film 102A which are located below the silicon oxide film 105 are sequentially dry-etched by using the silicon oxide film 105 as a mask. Thereby, floating gate electrodes 102 consisting of the polycrystalline silicon film 102A are formed, and control gate electrodes 104 (word lines WL) consisting of the polycrystalline silicon film 104A are formed.

Next, as shown in FIG. 48, impurity ions are implanted into the semiconductor substrate 100 corresponding to space regions between gate electrodes (floating gate electrodes 102 and control gate electrodes 104). Then, the semiconductor substrate 100 is heat-treated to diffuse the above-mentioned impurities, and thereby impurity introducing regions 107 for constituting source regions and drain regions of the MISFET are formed.

Next, as shown in FIG. 49, the gate oxide film 101 is etched (wet cleaning) by using a hydrofluoric acid solution in order to remove damages generated on the gate oxide film 101 in the gate electrode processing step and the ion implantation step as described above. Since the damages generated on the gate oxide film 101 become paths or the like through which electrons injected into the floating gate electrodes 102 leak from end portions of the floating gate electrodes 102 to the semiconductor substrate 100, degradation of the gate oxide film 101 is caused. It is, therefore, necessary to sufficiently remove the damages by performing this etching (wet cleaning).

However, if the gate oxide film 101 is cleaned by using the hydrofluoric acid solution, the surfaces of the silicon oxide film 105 serving as a protection insulating film which covers the upper portions of the control gate electrodes 104 are also etched simultaneously along with the gate oxide film 101. As a result, as shown in FIG. 49, respective sidewalls of the silicon oxide film 105 retreat toward the central directions of the respective gate electrodes.

Due to this, as shown in FIG. 50, when a silicon nitride film 108 serving as a sidewall insulating film is deposited on the semiconductor substrate 100 in the next step, stepped portions are generated on the silicon nitride film 108 in the vicinity of respective boundaries between each control gate electrode 104 and the silicon oxide film 105. As a result, when contact holes are formed in the space regions of the gate electrodes (floating gate electrodes 102 and control gate electrodes 104) by means of the SAC technique, the silicon nitride film 108 on each stepped portion described above is removed and thickness thereof becomes thin. Thereafter, a problem of defects has occurred such that a metal film embedded into each contact hole and the control gate electrode 104 become closer to each other in the vicinity of each stepped portion described above, and both become short-circuit according to circumstances. The problem like this arises even in the case where the protection insulating film covering the upper portion of each control gate electrode 104 is formed of a laminating film consisting of a silicon oxide film and a silicon nitride film.

As stated above, by consideration of the inventors, it has become clear that if a part of or all of the protection insulating film covering the upper portion of each control gate electrode is formed of a silicon oxide film in order to suppress stress of the gate oxide film and the substrate of the lower portion thereof, the stress being resulted from the silicon nitride film, then it is extremely difficult to realize the micro-fabrication of the MISFET by utilizing the SAC technique.

An object of the present invention is to provide a technique capable of realizing micro-fabrication of a MISFET using the SAC technique while stress resulting from a silicon nitride film and affecting a gate oxide film and a substrate of the lower portion thereof is suppressed.

Another object of the present invention is to provide a technique capable of promoting realization of mass storage and micro-fabrication of a flash memory.

The above and other objects and novel features of the present invention will be apparent from the description of the present specification and the accompanying drawings.

Of inventions disclosed by the present invention, typical embodiments thereof will be described as follows.

According to one embodiment of the present invention, a semiconductor integrated circuit device that is an object includes connection holes (contact holes) whose at least two sides are divided by at least one pair of laminating structure bodies that each are formed over a main surface of a semiconductor substrate to be adjacent to each other and that each consist of a first electrode insulating film, a floating gate electrode, a second gate insulating film, a control gate electrode and a first protection insulating film which are laminated in this order. The above-mentioned first protection insulating film has an etching prevention film at both sidewall portions thereof. When being in an etching step of said first gate insulating film along with the above-mentioned first protection insulating film, this etching prevention film is a substance that is difficult to etch in comparison with the first protection insulating film, that is, a substance that has a different etching rate, or a substance that is in fact not etched. Preferably the above-mentioned first protection insulating film includes a silicon oxide film, and the above-mentioned etching prevention film formed by the sidewall portions thereof is silicon nitride film.

In the case of forming, by a SAC technique, the contact holes in an interlayer insulating film such as a silicon oxide film existing between one pair of laminating structure bodies mentioned above, a thin silicon nitride film for a side spacer is first formed along the entire surfaces of the laminating structure bodies, and the interlayer insulating film is formed on the upper surface thereof so as to embed respective grooves between the laminating structure bodies. Then, relative to the interlayer insulating film like this silicon oxide film, the silicon nitride film which is difficult to etch and which is a side spacer insulating film becoming underlying, is used for etching as a stopper layer (stopper). In this case, when a satisfactory thickness as the etching stopper layer can not be ensured over the side spacer silicon nitride film covering the above-mentioned first protection insulating film, the first protection insulating film may be a laminating film which laminates a silicon nitride film over an upper layer of a silicon oxide film so as to be capable of enduring etching amounts required to form the connection holes of the above-mentioned interlayer insulating film. By doing so, the silicon nitride film of the above-mentioned first protection insulating film can be used as a part of the etching stopper layer. According to the above-stated embodiment, it is possible to omit or reduce use of a protection insulating film material such as a silicon nitride material in which stress affects the semiconductor substrate laminated over the control gate electrode.

According to another embodiment that is the present invention, a method for manufacturing a semiconductor integrated circuit device including an MIS transistor structure on a main surface of a semiconductor substrate is an object, and is characterized by the steps of: forming a first gate insulating film to cover an active region over the main surface of the semiconductor substrate; forming at least one pair of laminating structure bodies which each comprises a floating gate electrode, a second gate insulating film, a control gate electrode and a first protection insulating film which are laminated in this order; introducing impurities for forming a source or a drain through the first gate insulating film exposed between said pair of laminating structure bodies; and removing or cleaning exposed portions of said first gate insulating film given damages in the above-mentioned impurity introduction step, wherein an etching prevention film is formed on the sidewall portions of said first protection insulating film in the step of forming the above-mentioned laminating structure bodies so that the sidewall portions of said first protection insulating film is not retreated in the removing or cleaning step. In a preferable embodiment, the above-mentioned first protection insulating film may include a silicon oxide film, and, for the same reason stated above, may be a laminating film consisting of a silicon oxide film and a silicon nitride film. On the other hand, the above-mentioned etching prevention film covering the sidewall portions of the first protection insulating film is a silicon nitride film. By so constitution, it is possible to omit or reduce use of a protection insulating film material such as a silicon nitride material in which stress thereof affects the semiconductor substrate laminated over the control gate electrode. Further, in the step of removing or cleaning the exposed portion of the above-mentioned first gate insulating film, removing or cleaning of the first gate insulating film exposed below the floating gate electrode can be satisfactorily carried on, in comparison with cleaning in a general transistor manufacturing step. Accordingly, in particular, since the damaged parts of the first gate insulating film can be removed, characteristics of holding information written into a flash memory can be improved.

According to still another embodiment that is the present invention, a method for manufacturing a semiconductor integrated circuit device having an MIS transistor structure of a flash memory includes the steps of:

(a) forming, on a main surface of a semiconductor substrate, a first gate insulating film consisting of a silicon oxide film, and forming a first conductive film, a second gate insulating film and a second conductive film over said first gate insulating film in this order;

(b) forming a first protection insulating film consisting of one of a single layer film and a laminating film, said single layer film being a silicon oxide film formed over said second conductive film, and said laminating film being a silicon nitride film formed over the silicon oxide film;

(c) patterning said first protection insulating film, and thereby forming an etching mask consisting of said first protection insulating film;

(d) patterning said second conductive film, said second gate insulating film and said first conductive film in this order by dry etching using said etching mask as a mask, and thereby forming a plurality of gate electrodes that each have a floating gate electrode consisting of said first conductive film and a control gate electrode consisting of said second conductive film and that each have a laminating structure in which an upper portion of said control gate electrode is covered with said first protection insulating film;

(e) forming a etching prevention film consisting of a silicon nitride film on both sidewall portions of said first protection insulating film patterned, after said step (c) and before said step (d), or after said step (d);

(f) introducing impurities into the main surface of said semiconductor substrate located between sidewall portions facing each other in said plurality of gate electrodes, and thereby forming a source region and a drain region;

(g) treating a surface of said semiconductor substrate by using etchant containing a hydrofluoric acid after said step (f), and thereby cleaning said first gate insulating film located between the sidewall portions which face each other in said plurality of gate insulating film;

(h) covering an upper portion and both sidewall portions of each of said plurality of gate electrodes after said step (g), and forming a second protection insulating film consisting of a silicon nitride film having such a thickness as to partially embed a region between the sidewall portions which face each other in said plurality of gate electrodes;

(i) forming, on an upper portion of said second protection insulating film, an interlayer insulating film consisting of a silicon oxide film, and embedding, with said interlayer insulating film, the region between the sidewall portions which face each other in said plurality of gate electrodes;

(j) etching said interlayer insulating film and said second protection insulating film located between the sidewall portions which face each other in said plurality of gate electrodes, and thereby forming a first connection hole for exposing a surface of said source region and a second connection hole for exposing a surface of said drain region; and (k) forming a third conductive film electrically connected to said source region inside said first connection hole, and forming a fourth conductive film electrically connected to said drain region inside said second connection hole.

According to this embodiment, since the first protection insulating film covering the upper portion of the control gate electrode is constituted by a silicon oxide film, it is possible to reduce stress which affects the first gate oxide film and the semiconductor substrate which is located below a lower portion thereof, and to suppress generation of crystal defects in the first gate oxide film.

Further, since the etching prevention film consisting of a silicon nitride film is formed over both sidewall portions of the first protection insulating film consisting of the above-mentioned silicon oxide film, it is possible to prevent such drawbacks that the first protection insulating film is etched and retreated when the first gate insulating film is cleaned by etchant containing a hydrofluoric acid.

Moreover, since the first protection insulating film is prevented from retreating, the sidewall portions of the above-mentioned second protection insulating film is prevented from being unnecessarily etched and thereby removed during processing of anisotropic etching of the silicon nitride film which is the second protection insulating film. As a result, as described above with reference to FIG. 50, it is possible to prevent a disadvantage of decrease in withstand voltage between the conductive film being in contact with the drain region or the source region and the control gate electrode, or a disadvantage of short-circuit between those conductors.

DESCRIPTION OF THE PREFERRED EMBODIMENTS

Embodiments of the present invention will be described below in detail with reference to the drawings. In all the drawings for describing the embodiments, members having the same function are denoted by the same reference numbers and repetitive description thereof will be omitted.

First Embodiment

Figure 1:
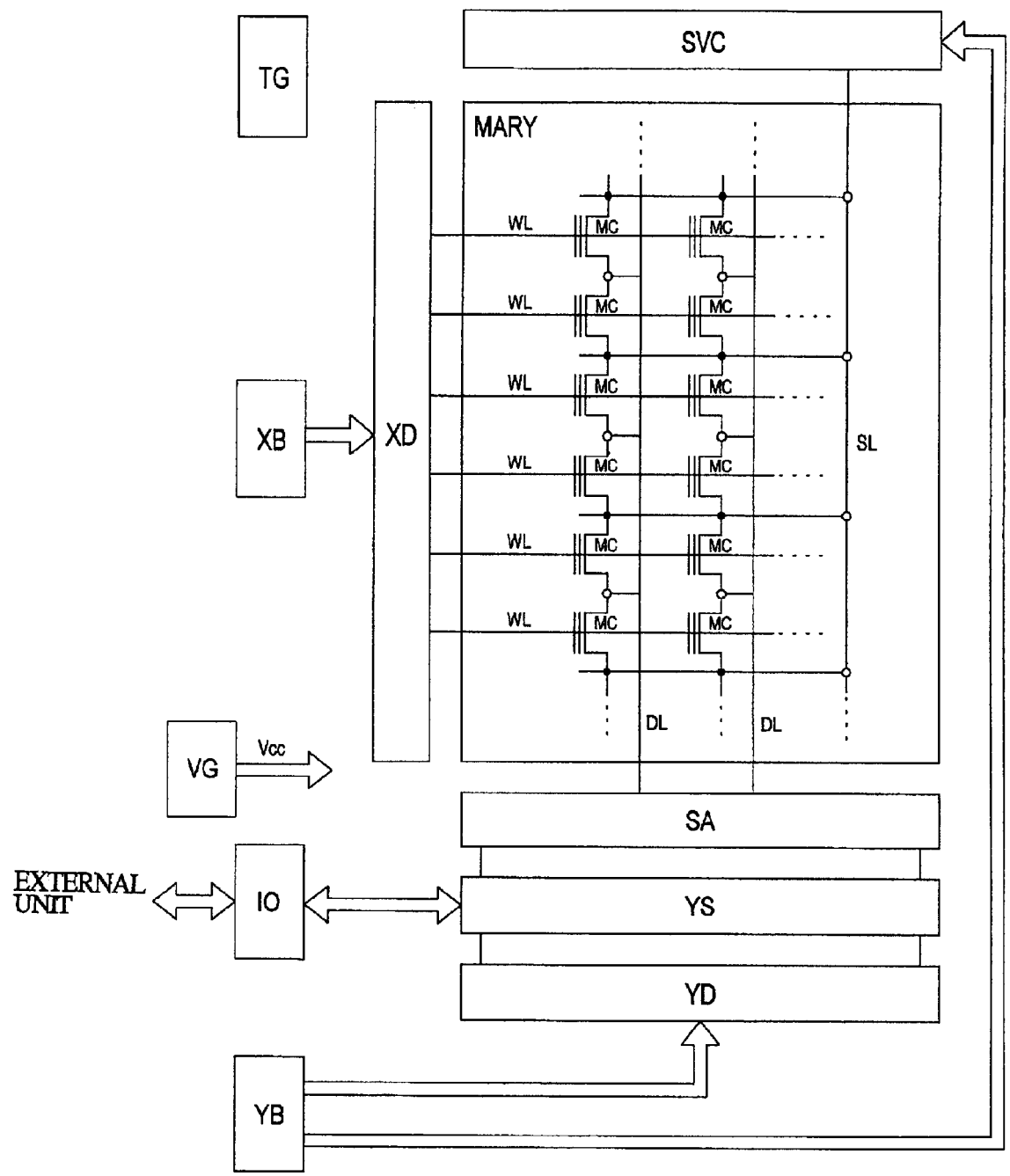
FIG. 1 is a block diagram showing principal parts of an NOR type flash memory that is a first embodiment of the present invention.

FIG. 1 is a block diagram showing principal parts of a flash memory (electrically batch-erasable and rewritable nonvolatile semiconductor memory device) that is an embodiment of the present invention.

The flash memory is formed over a main surface of a semiconductor chip made of monocrystalline silicon. The flash memory has a memory array (MARY) constituting storage sections, and peripheral circuit sections arranged around the memory array.

The memory array (MARY) has the predetermined number of word lines WL, the predetermined number of data lines DL, and many memory cells MC. Each of the word lines WL extends parallel to a right-and-left direction in FIG. 1. Each of the data lines DL extends parallel to an up-and-down direction in FIG. 1. The memory cells MC are arranged in a lattice shape at intersections between the word lines WL and the data lines DL, respectively. Each of the memory cells MC is constituted by a MISFET having a two-layer gate structure including a floating gate electrode and a control gate electrode. The structure of this MISFET and a manufacturing method of the MISFET will be described later in detail.

The flash memory in this embodiment employs, for example, an NOR type memory array structure. The NOR type flash memory constitutes cell units each using, as a unit, the predetermined number (e.g., sixteen) of memory cells MC arranged on the same row. The control gate electrode of each of the memory cells MC constituting a cell unit is connected to a corresponding word line WL. Also, a drain region of each memory cell MC is connected to a corresponding data line DL and a source region thereof is connected to a source line SL extending in the up-and-down direction in FIG. 1.

The word lines WL are connected to an X address decoder XD and the source lines SL are connected to a source voltage control circuit SVC. Also, the data lines DL are connected to an input/output circuit IO through a sense amplifier SA and a Y switch circuit YS.

The X address decoder XD is supplied with an internal X address signal from an X address buffer XB, with various internal control signals from a timing generation circuit TG, and with various internal voltages from a internal voltage generation circuit VG. Also, the source voltage control circuit SVC is supplied with an internal Y address signal from a Y address buffer YB, with various internal control signals from the timing generation circuit TG, and with various internal voltages from the internal voltage generation circuit VG. Further, the Y switch circuit YS is supplied with a data line select signal from the Y address decoder YD, and the Y address decoder YD is supplied with an internal Y address from the Y address buffer YB. The X address buffer XB is supplied with an X address signal from an external unit, and the Y address buffer YB is supplied with a Y address signal therefrom.

The X address buffer XB forms the internal X address signal on the basis of the X address signal supplied, and supplies the formed internal X address signal to the X address decoder XD. The X address decoder XD decodes the internal X address signal supplied from the X address buffer XB, and sets the word lines WL over the memory array (MARY) to be at a select or unselect level.

On the other hand, the Y address buffer YB forms an internal Y address signal on the basis of the Y address signal supplied, and supplies the formed internal Y address signal to the source voltage control circuit SVC and to the Y address decoder YD. Also, the source voltage control circuit SVC decodes the internal Y address signal supplied from the Y address buffer YB, and sets the source lines SL on the memory array (MARY) to be at a select or unselect level. The Y address decoder YD decodes the internal Y address signal supplied from the Y address buffer YB, and sets the data line select signal to be at a select level relative to the Y switch circuit YS. Further, the Y switch circuit YS is selectively connected between a corresponding circuit of the sense amplifier SA and the input/output circuit IO, in response to a high level of the data line select signal supplied from the Y address decoder YD.

The timing generation circuit TG selectively forms various internal control signals on the basis of a chip enable signal (CEB), a write enable signal (WEB) and an output enable signal (OEB) which are supplied from the external unit as starting control signals, and supplies the various internal control signals to respective portions of the flash memory. Also, the internal voltage generation circuit VG generates various internal voltages on the basis of power source voltages (Vcc and Vss) supplied from the external unit, and supplies the various internal voltages to respective portions of the flash memory. The power source voltage Vcc has a positive potential such as 3.3V. In addition, the internal voltages generated by the internal voltage generation circuit VG include various potentials such as 10V, 3V or 1V necessary for write, erase or read operation.

Figure 2:
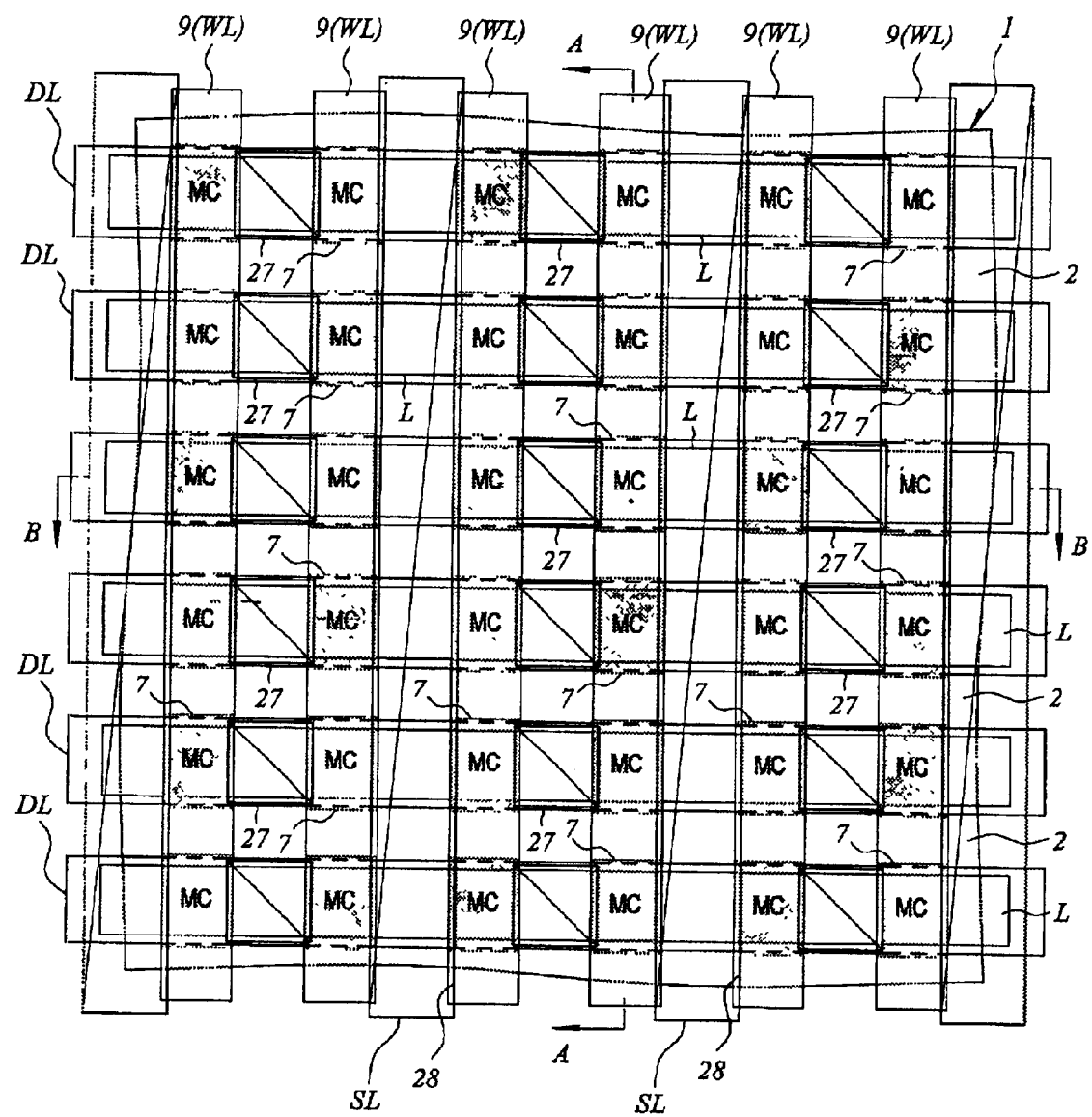
FIG. 2 is a plan view showing principal parts of memory array in the flash memory that is the first embodiment of the present invention.
Figure 3:
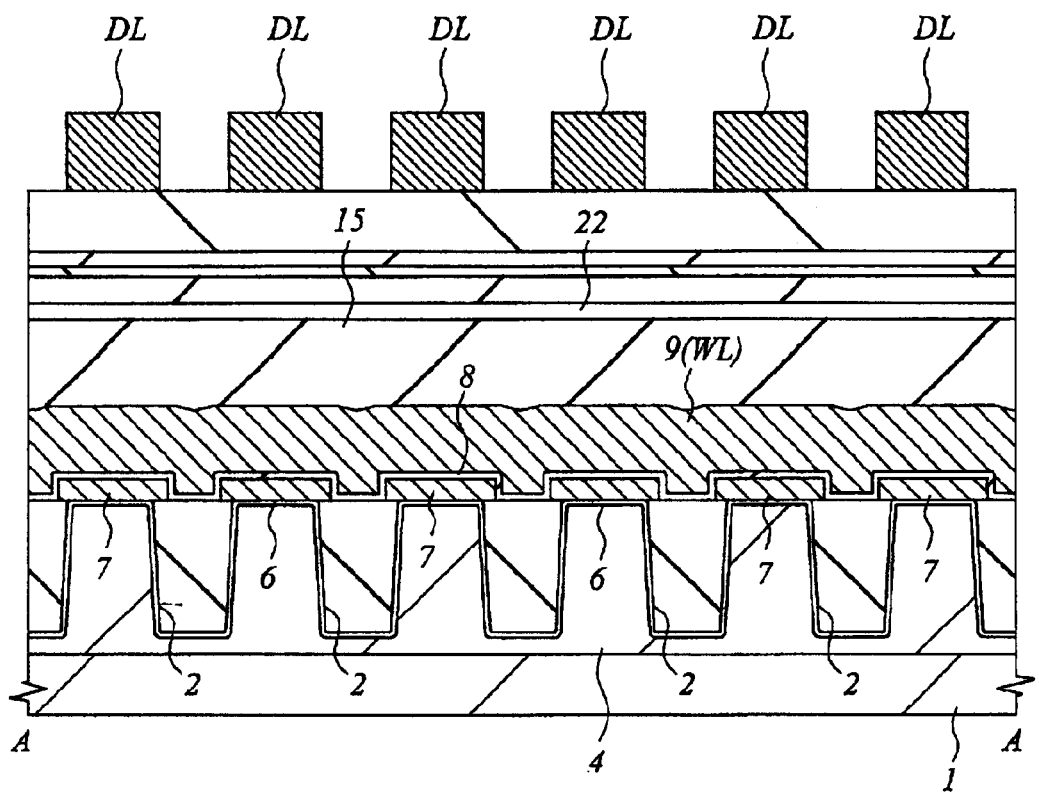
FIG. 3 is a cross-sectional view showing principal parts of a semiconductor substrate taken along line A—A in FIG. 2.
Figure 4:
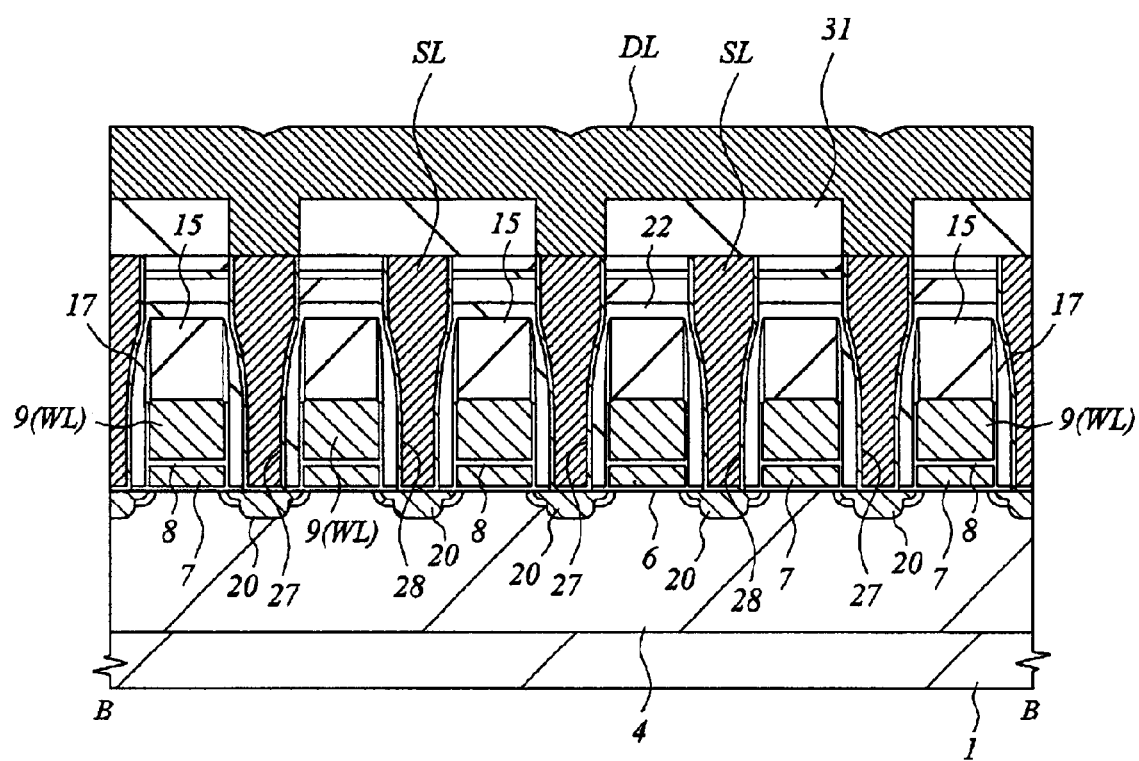
FIG. 4 is a cross-sectional view showing principal parts of the semiconductor substrate taken along line B—B in FIG. 2.
Figure 5:
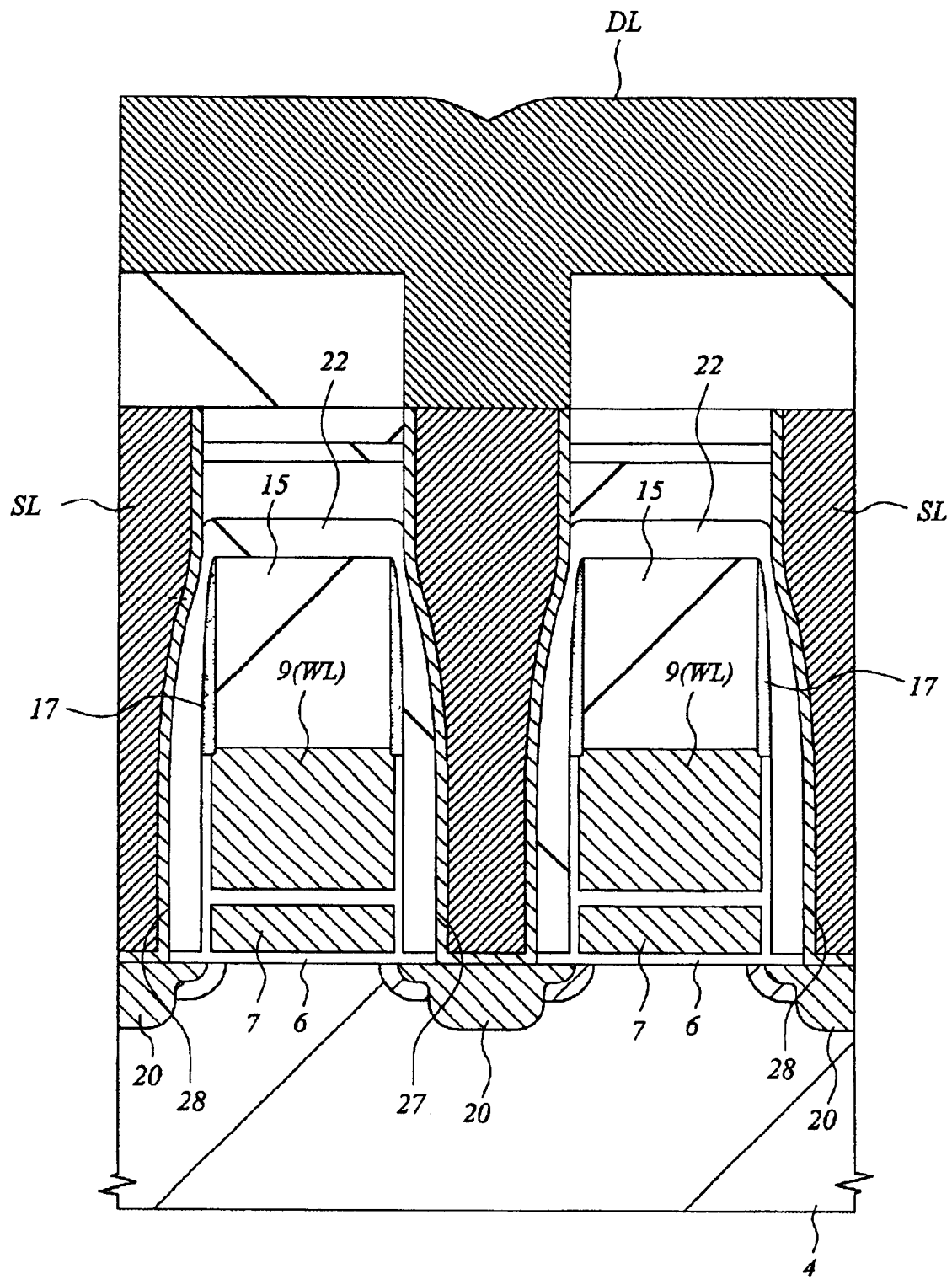
FIG. 5 is an enlarged cross-sectional view of FIG. 4.

FIG. 2 is a plan view of principal parts of the memory array (MARY) mentioned above. FIG. 3 is a cross-sectional view taken along line A—A in FIG. 2. FIG. 4 is a cross-sectional view taken along line B—B in FIG. 2. FIG. 5 is an enlarged cross-sectional view of FIG. 4.

A p-type well 4 is formed in a semiconductor substrate (referred to as substrate hereinafter) 1 made of p-type single crystalline silicon. Many active regions L, whose circumferences are surrounded by element isolation grooves 2, are formed in this p-type well 4. Each of these active regions L has a long band-like plane pattern extending parallel to a right-and-left direction in FIG. 2.

Many word lines WL extending parallel to the up-and-down direction in FIG. 2 and many data lines DL extending parallel to the right-and-left direction in FIG. 2, i.e., a direction orthogonal to the word lines WL are formed over the substrate 1 of the memory array (MARY). Many memory cells MC are arranged in a lattice shape at the intersections between these word lines WL and data lines DL, respectively.

A MISFET constituting the above-mentioned memory cells MC includes a gate oxide film (first gate insulating film) 6 formed on a surface of the p-type well 4, a floating gate electrode 7 formed on the gate oxide film 6, an ONO film (second gate insulating film) 8 formed on the floating gate electrode 7, a control gate electrode 9 formed on the ONO film 8, and n-type impurity introduced regions (a source region and a drain region) 20 formed in the p-type well 4 at both sides of gate electrodes (floating gate electrode 7 and control gate electrode 9).

The control gate electrode 9 of the above-mentioned MISFET constitutes a word line WL in a region other than the active region L. A data line DL is connected to one (drain region) of then-type impurity introduced regions 20 of the MISFET through each contact hole (connection hole) 27 formed at each upper portion thereof, and a source line SL is connected to the other region (source region) through each contact hole (connection hole) 28 formed at each upper portion thereof.

As shown in FIG. 5, a silicon oxide film (first protection insulating film) 15 is formed on the control gate electrode 9 (word line WL) of the MISFET constituting each memory cell MC. An etching prevention film 17 made of a silicon nitride film is formed on each sidewall of the silicon oxide film 15. The function of this etching prevention film 17 will be described later. A silicon nitride film (second protection insulating film) 22 is formed on the sidewall of the gate electrode (the floating gate electrode 7 and the control gate electrode 9) and on an upper surface of the silicon oxide film 15. This silicon nitride film 22, as will be described later, is used to form each of the above-mentioned contact holes 27 and 28 by a self alignment relative to the gate electrode (floating gate electrode 7 and control gate electrode 9).

In write operation into the memory cell MC, a voltage of 6V is applied to the drain region of the selected memory cell MC and a voltage of 9V is applied to the control gate electrode 9 thereof while the source region thereof and the well 4 are set to have a reference potential (zero potential). By doing so, a peak of electric field intensity is generated at an end portion of the drain region, a channel current is changed to hot electrons (e⁻) in this drain region, and the hot electrons are injected into the floating gate electrode 7 through the gate oxide film 6. Thereby, the write operation is executed.

In addition, in read operation, a voltage of 1V is applied to the drain region of the selected memory cell MC and a voltage of 5V is applied to the control gate electrode 9 thereof while the source region thereof and the well 4 are set to have a reference potential(zero potential). Thereby, accumulation information is detected by detecting the presence/absence of drain current flowing in the selected transistor. On the other hand, in erase operation, the drain regions and the well regions of the memory cell MC are set to be in floating states, a voltage of 0V is applied to the control gate electrode 9 thereof, a voltage of 14V is applied to the source region thereof, and electrons accumulated in the floating gate electrode 7 are discharged to a source region side by FN tunneling of the gate oxide film 6. Therefore, the erase operation is executed.

Next, a manufacturing method of flash memory in this embodiment will be described in the order of steps with reference to FIGS. 6 to 38. Among these figures, cross-sectional views each having a reference symbol A—A are cross-sectional views taken along line A—A in FIG. 2 and cross-sectional views each having a reference symbol B—B are cross-sectional views taken along line B—B in FIG. 2.

Figure 6:
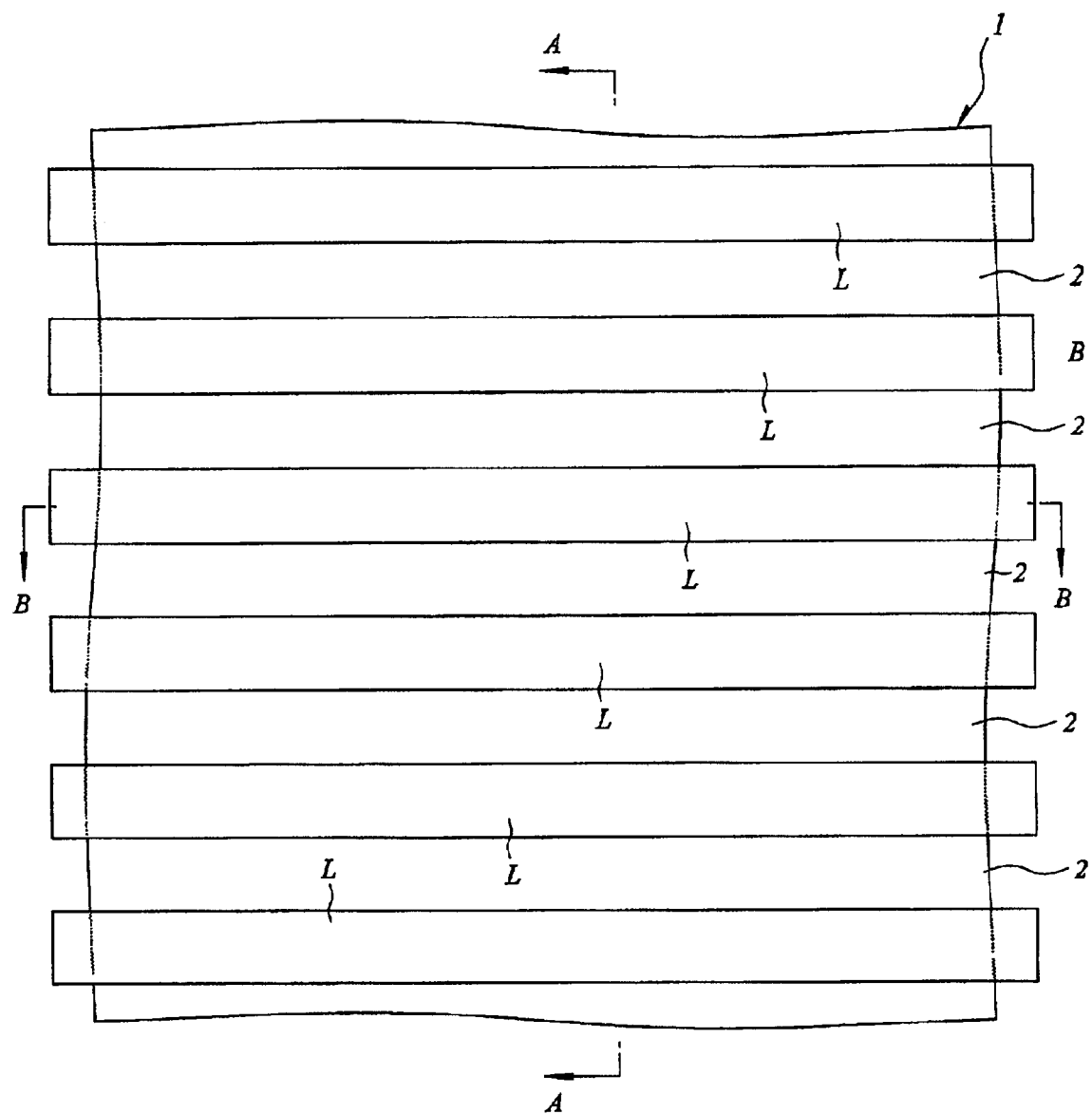
FIG. 6 is a plan view of principal parts showing a method for manufacturing a flash memory that is the first embodiment of the present invention.
Figure 7:
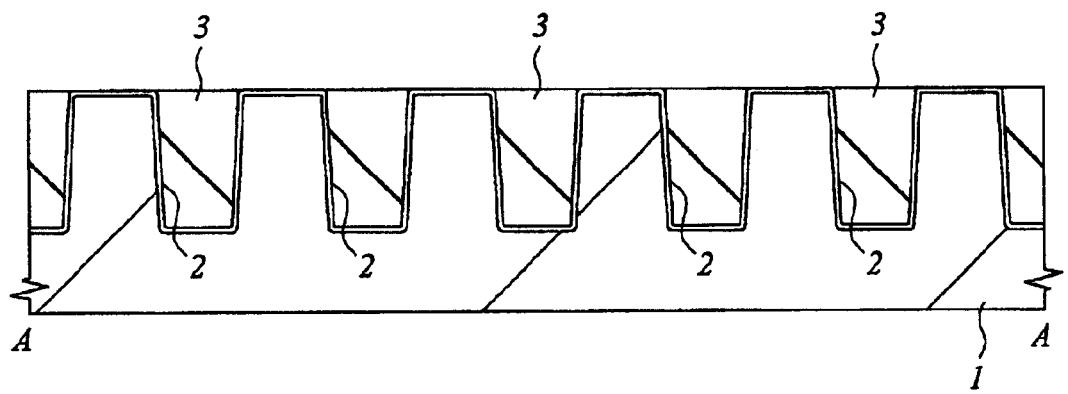
FIG. 7 is a cross-sectional view of principal parts showing the method for manufacturing a flash memory that is the first embodiment of the present invention.

First, as shown in FIG. 6 (which is a plan view showing principal parts of a memory array region) and FIG. 7, a plurality of element isolation grooves 2 are formed in element isolation regions on the main surface of the substrate 1. Each of the element isolation grooves 2 is formed by etching the main surface of the substrate 1 to form a groove having a depth of about 250 nm, by depositing a silicon oxide film 3 having a thickness of about 600 nm on the substrate 1 including the interior of this groove by a CVD method, and thereafter by polishing and removing, from the silicon oxide film 3, unnecessary portions outside the groove by a chemical mechanical polishing or CMP method. As shown in FIG. 6, by forming these element isolation grooves 2, many active regions L each having a long band-like plane pattern extending parallel to a right-and-left direction in FIG. 6 are formed over the substrate 1 of the memory array.

Figure 8:
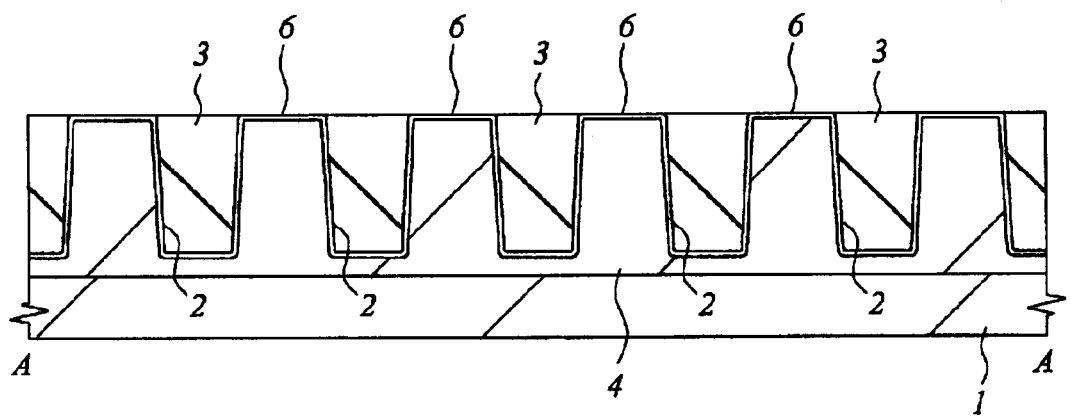
FIG. 8 is a cross-sectional view of principal parts showing the method for manufacturing a flash memory that is the first embodiment of the present invention.

Next, as shown in FIG. 8, after p-type impurities, e.g., B (boron) ions are implanted into the surface of the substrate 1, the substrate 1 is subjected to a heat treatment at a temperature of about 1000° C. to diffuse the p-type impurities into the substrate 1. Thereby, a p-type well 4 is formed. Next, the substrate 1 is subjected to wet oxidation at a temperature of 800° C. to 900° C., and thereby a gate oxide film 6 having a thickness of about 10 nm is formed on the surface of the p-type well 4.

Figure 9:
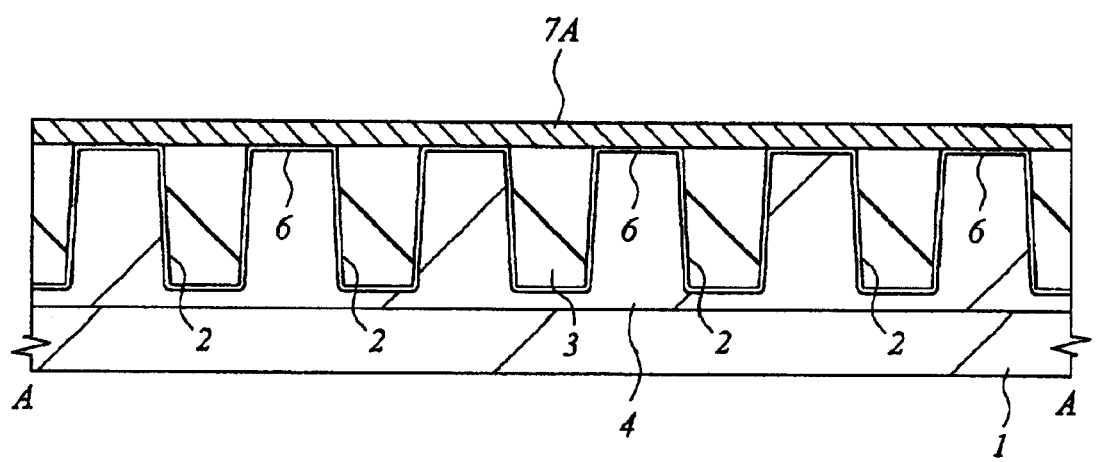
FIG. 9 is a cross-sectional view of principal parts showing the method for manufacturing a flash memory that is the first embodiment of the present invention.
Figure 10:
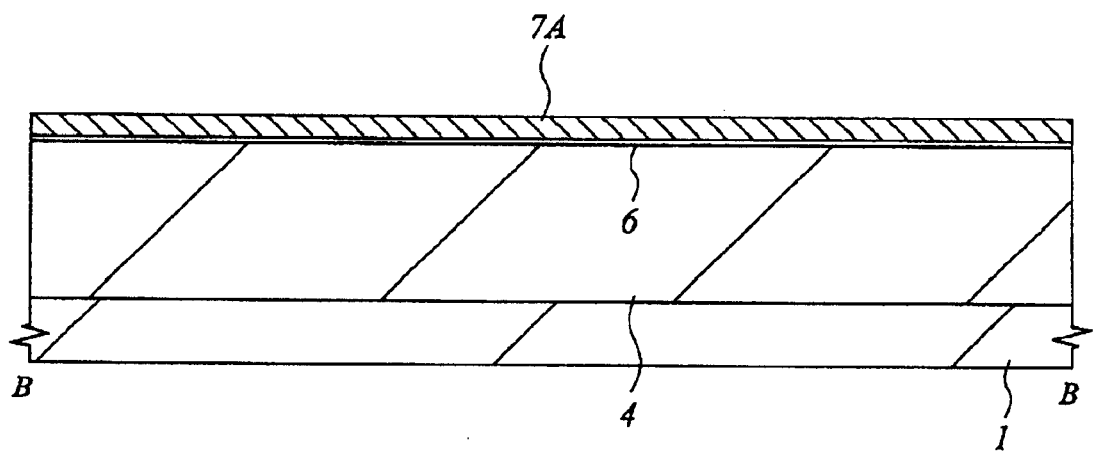
FIG. 10 is a cross-sectional view of principal parts showing the method for manufacturing a flash memory that is the first embodiment of the present invention.

Next, as shown in FIG. 9 and FIG. 10, a polycrystalline silicon film 7A having a thickness of about 70 nm to 100 nm is deposited over the substrate 1 by a CVD method. N-type impurities, e.g., phosphorus (P) are doped into the polycrystalline silicon film 7A during the deposition step. Alternatively, after an not doped polycrystalline silicon film 7A is deposited, n-type impurities may be doped into the film 7A by an ion implantation method. The polycrystalline silicon film 7A is used as the floating gate electrode 7 of the MISFET constituting each memory cell.

Figure 11:
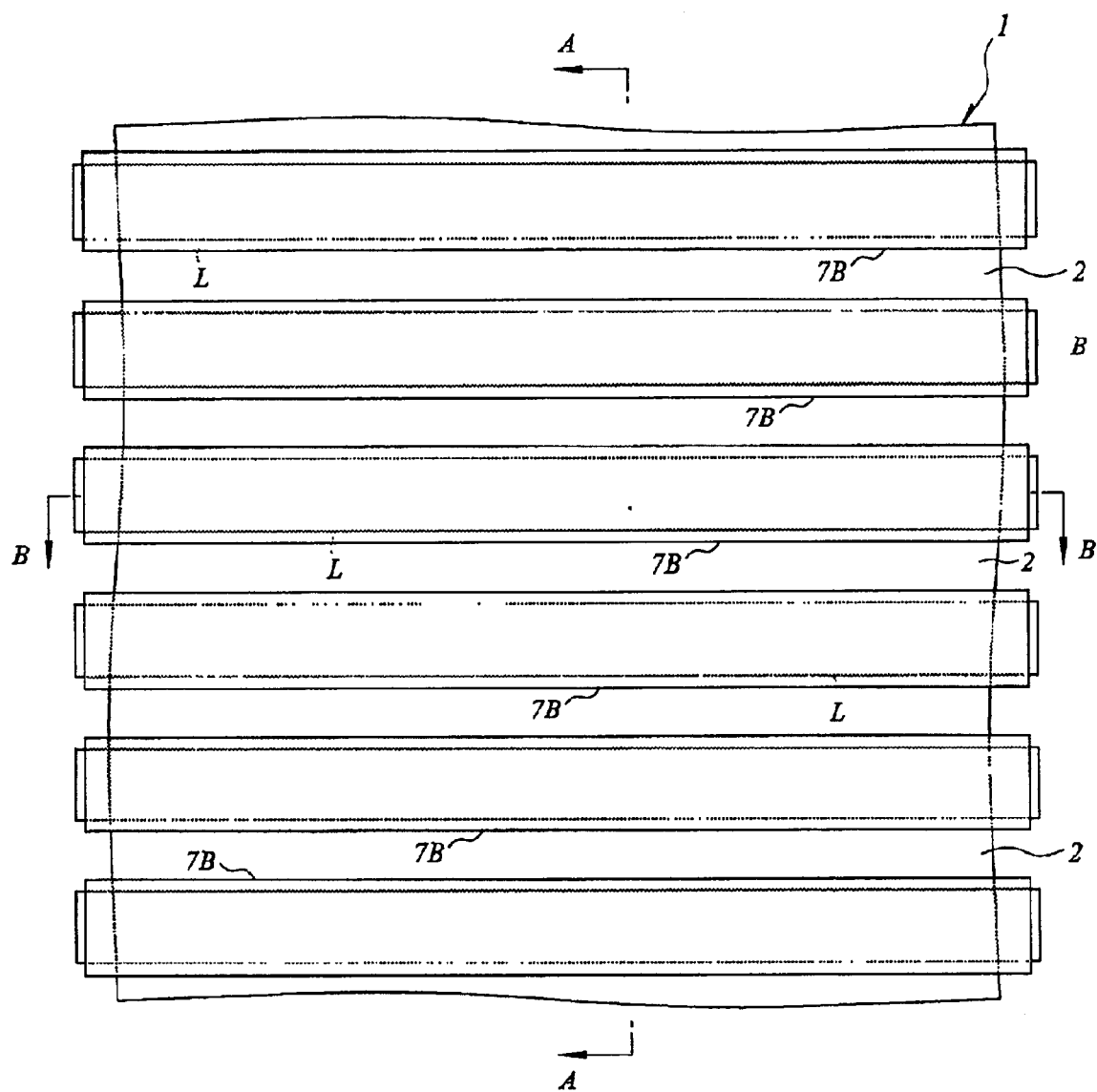
FIG. 11 is a plan view of principal parts showing the method for manufacturing the flash memory that is the first embodiment of the present invention.
Figure 12:
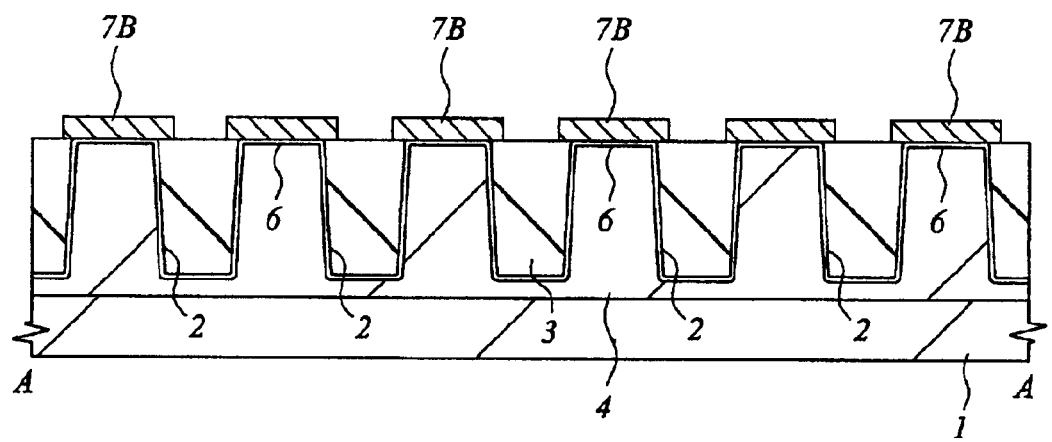
FIG. 12 is a cross-sectional view of principal parts showing the method for manufacturing a flash memory that is the first embodiment of the present invention.
Figure 13:
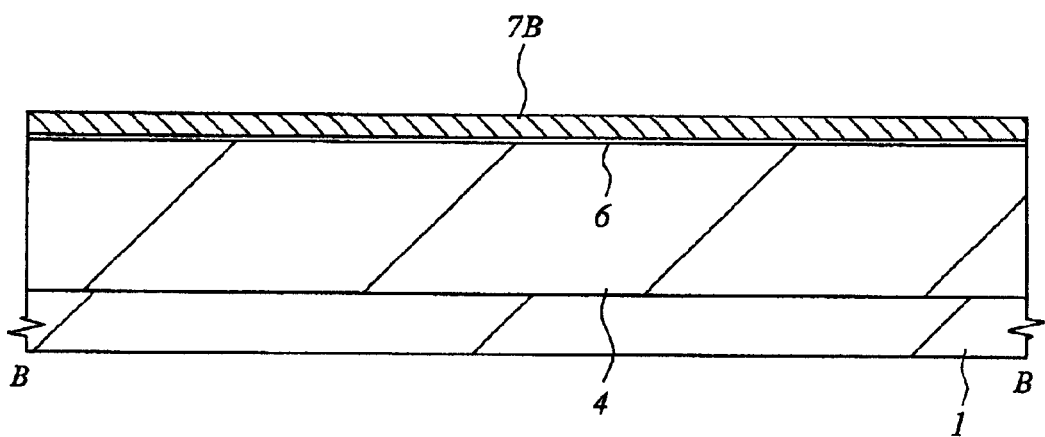
FIG. 13 is a cross-sectional view of principal parts showing the method for manufacturing a flash memory that is the first embodiment of the present invention.

Next, as shown in FIGS. 11, 12 and 13, the polycrystalline silicon film 7A is subjected to dry etching using a photoresist film as a mask, and thereby a polycrystalline silicon film 7B having an long band-like plane pattern extending along a direction of extension thereof is formed at an upper portion of the active region L.

Figure 14:
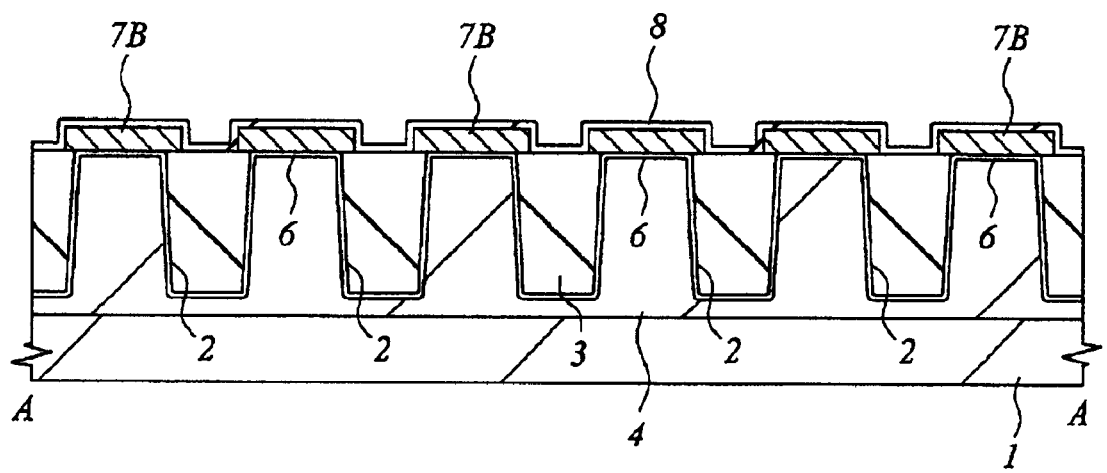
FIG. 14 is a cross-sectional view of principal parts showing the method for manufacturing a flash memory that is the first embodiment of the present invention.
Figure 15:
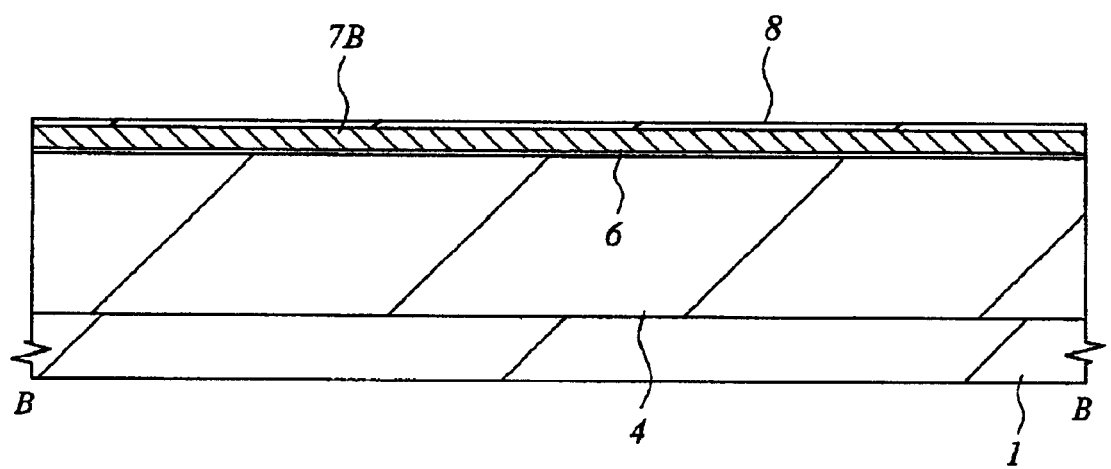
FIG. 15 is a cross-sectional view of principal parts showing the method for manufacturing a flash memory that is the first embodiment of the present invention.

Next, as shown in FIGS. 14 and 15, an ONO film 8 consisting of a silicon oxide film, a silicon nitride film and a silicon oxide film is formed over the substrate 1 over which the polycrystalline silicon film 7B has formed. The ONO film 8 is used as the second gate insulating film of the MISFET constituting each memory cell. The ONO film 8 is formed by, for example, sequentially depositing a silicon oxide film having a thickness of 5 nm, a silicon nitride film having a thickness of 7 nm and a silicon oxide film having a thickness of 4 nm over the substrate 1 in this order by a CVD method.

Figure 16:
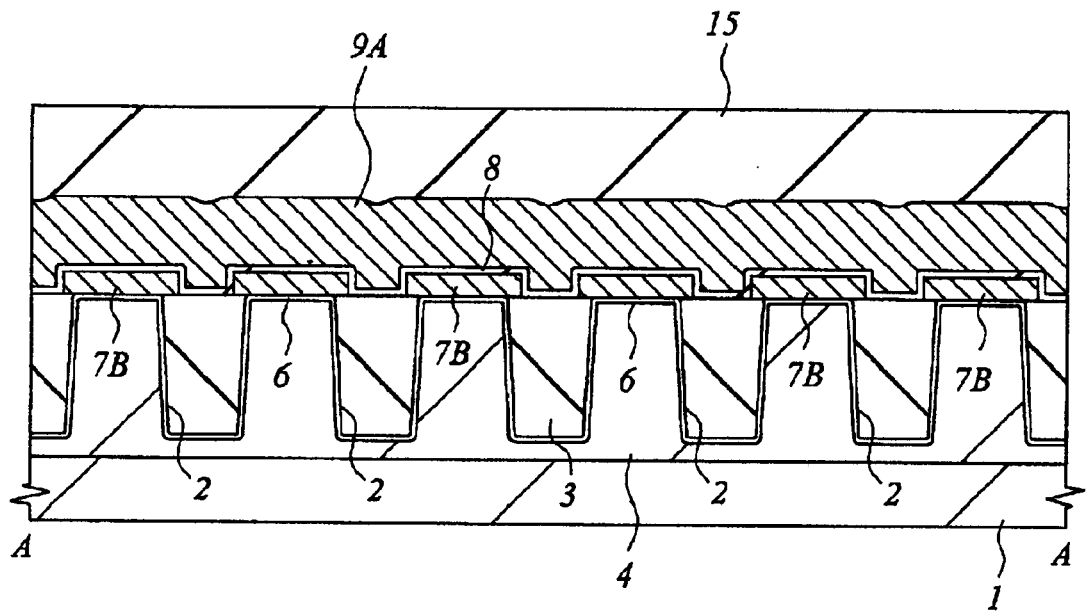
FIG. 16 is a cross-sectional view of principal parts showing the method for manufacturing a flash memory that is the first embodiment of the present invention.
Figure 17:
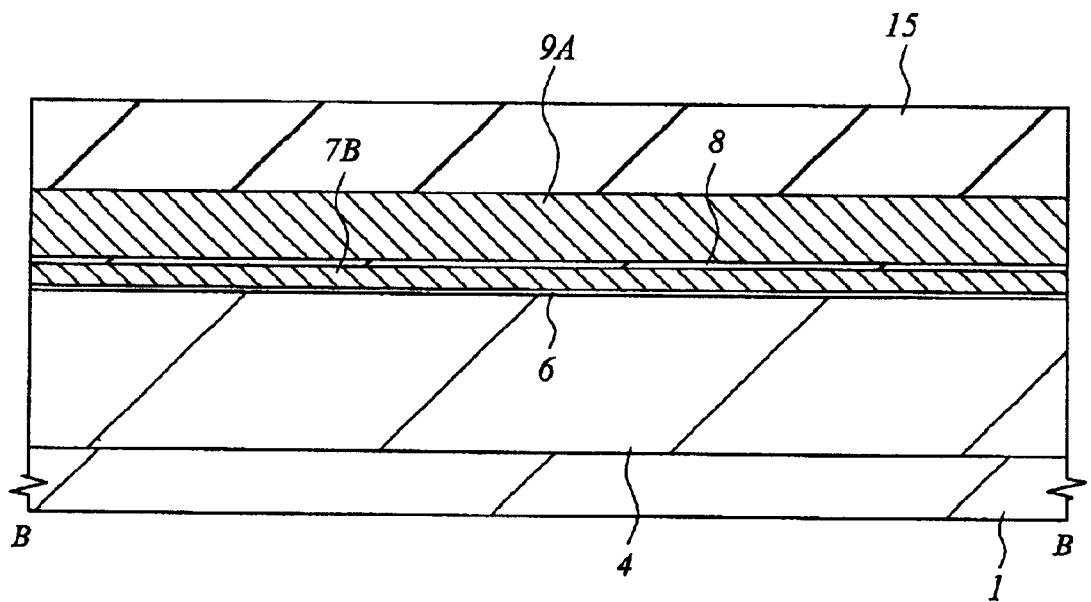
FIG. 17 is a cross-sectional view of principal parts showing the method for manufacturing a flash memory that is the first embodiment of the present invention.

Then, as shown in FIGS. 16 and 17, a polycrystalline silicon film 9A having a thickness of about 200 nm is formed on an upper portion of the ONO film 8. Then, a silicon oxide film 15 having a thickness of about 300 nm is formed on an upper portion of the polycrystalline silicon film 9A. The polycrystalline silicon film 9A is deposited by a CVD method, and then n-type impurities are doped thereinto by an ion implantation method. The silicon oxide film 15 is deposited by a thermal CVD method for thermally decomposing, for example, tetraethoxy silane gas at a temperature of about 700° C. The polycrystalline silicon film 9A is used as the control gate electrode 9 and the word line WL of the MISFET constituting each memory cell. Also, the silicon oxide film 15 is used as an insulating film for protecting an upper portion of the control gate electrode 9.

As can be seen, in this embodiment, the insulating film for protecting the upper portion of the control gate electrode 9 is constituted by the silicon oxide film 15. Due to this, great stress does not occur in the gate oxide film 6 and the substrate 1 located at the lower portion thereof, differently from the case where this insulating film is constituted by a silicon nitride film. As a result, it is possible to suppress occurrence of crystal defects in the gate oxide film 6, and therefore to realize high quality of the gate oxide film 6 in which the generation of leakage current is extremely little.

Figure 18:
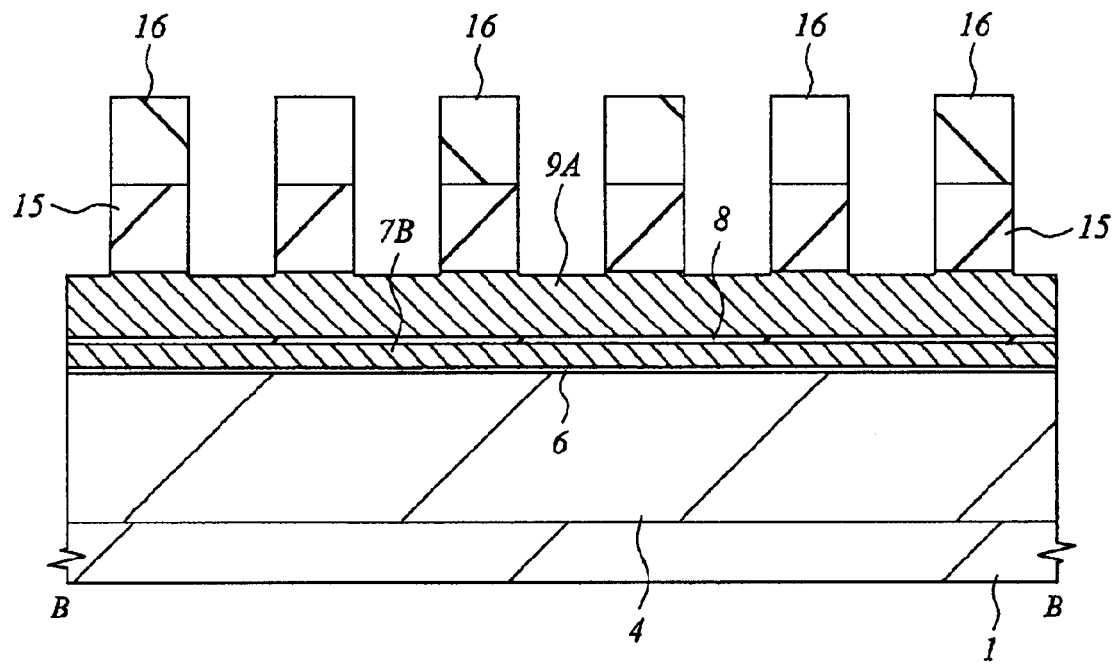
FIG. 18 is a cross-sectional view of principal parts showing the method for manufacturing a flash memory that is the first embodiment of the present invention.

Next, as shown in FIG. 18, the silicon oxide film 15 is subjected to dry etching using a photoresist film 16 as a mask, and thereby a part of the polycrystalline silicon film 9A is exposed. The silicon oxide film 15 that has been subjected to dry etching has a long band-like plane pattern extending in a direction orthogonal to a direction in which the active region L extends.

Figure 19:
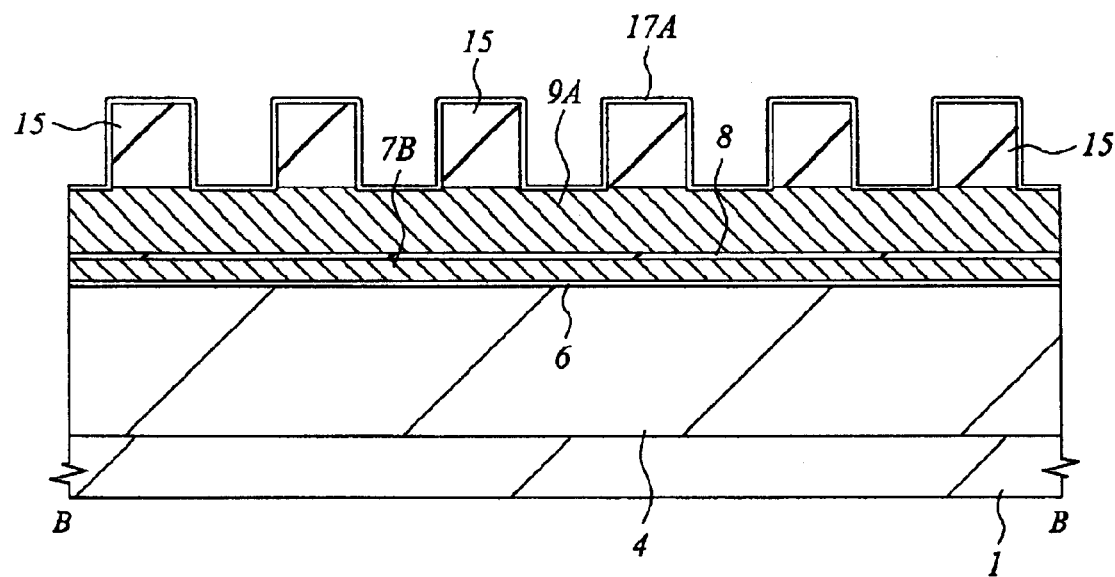
FIG. 19 is a cross-sectional view of principal parts showing the method for manufacturing a flash memory that is the first embodiment of the present invention.
Figure 20:
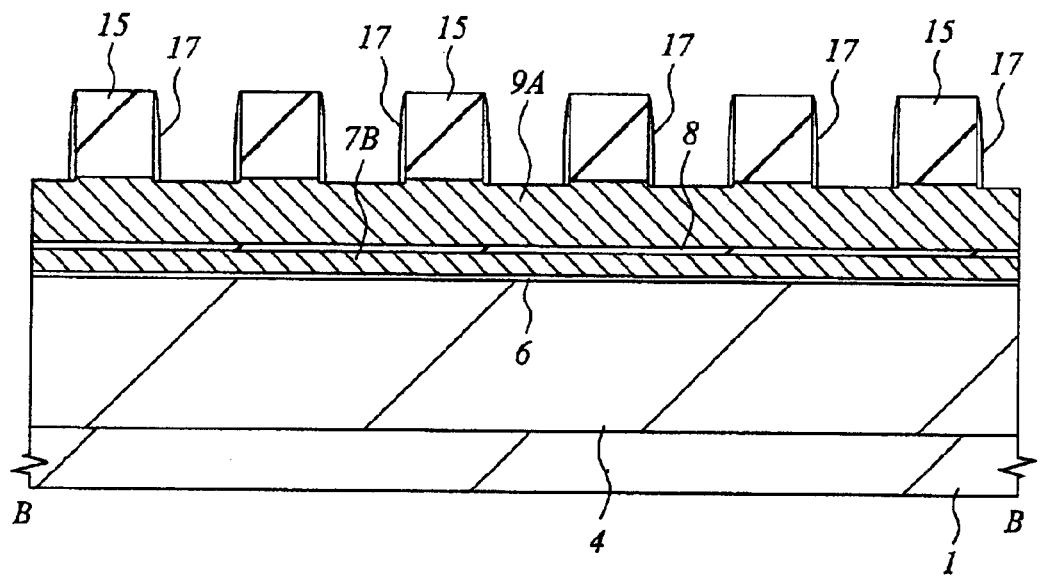
FIG. 20 is a cross-sectional view of principal parts showing the method for manufacturing a flash memory that is the first embodiment of the present invention.

Then, after the photoresist film 16 is removed, a thin silicon nitride film 17A having a thickness of about 15 nm to 30 nm is deposited over the substrate 1 by a CVD method as shown in FIG. 19. Thereafter, as shown in FIG. 20, the silicon nitride film 17A is subjected to anisotropic dry etching to be left only on the sidewall of the silicon oxide film 15, and thereby a etching prevention film 17 formed of the silicon nitride film 17A is formed on this sidewall.

Figure 21:
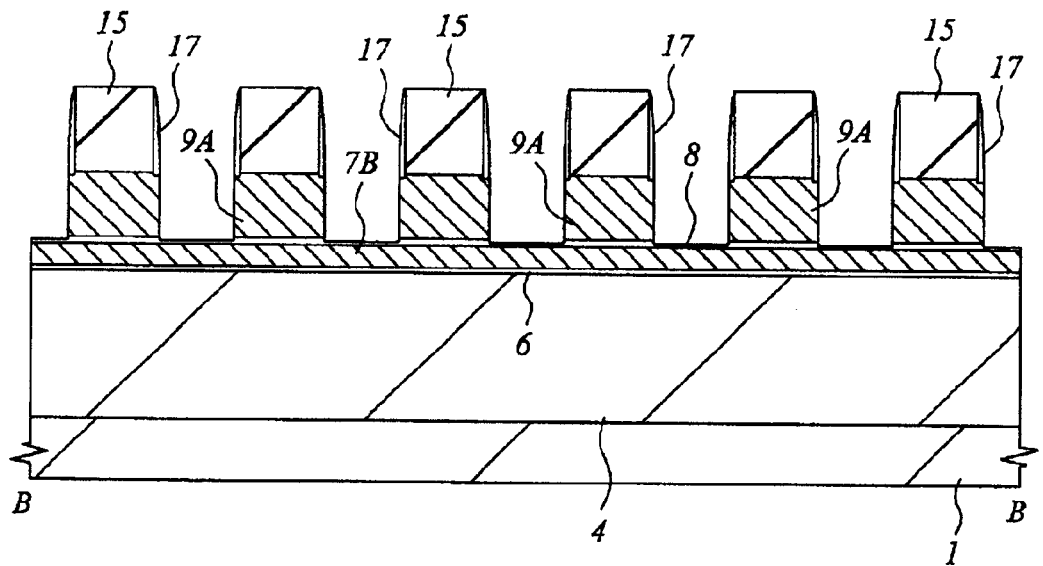
FIG. 21 is a cross-sectional view of principal parts showing the method for manufacturing a flash memory that is the first embodiment of the present invention.
Figure 22:
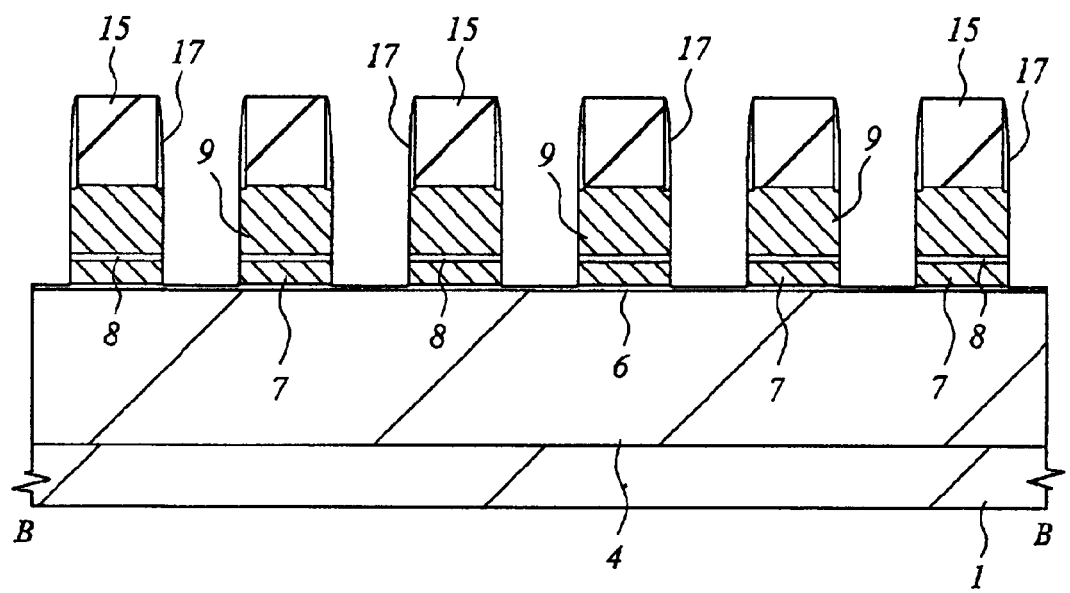
FIG. 22 is a cross-sectional view of principal parts showing the method for manufacturing a flash memory that is the first embodiment of the present invention.
Figure 23:
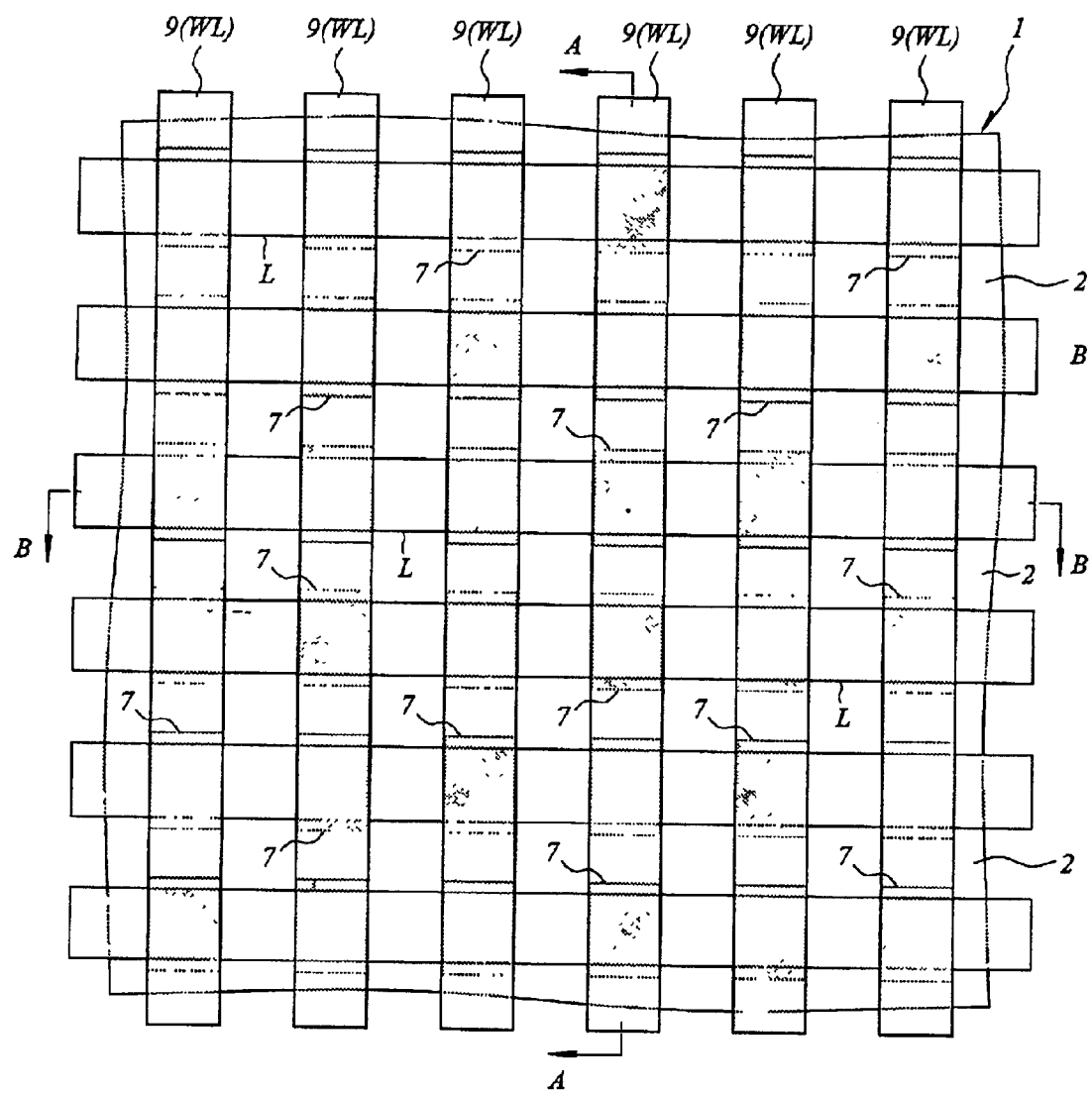
FIG. 23 is a plan view of principal parts showing the method for manufacturing the flash memory that is the first embodiment of the present invention.

Next, as shown in FIG. 21, by using, as a mask, the silicon oxide film 15 having the etching prevention films 17 formed on the sidewall thereof, the polycrystalline silicon film 9A is subjected to dry etching. Then, as shown in FIG. 22, the ONO film 8 and the polycrystalline silicon film 7B that are located below the polycrystalline silicon film 9A are sequentially subjected to dry etching in this order. Thereby, the floating gate electrode 7 consisting of the polycrystalline silicon film 7B and the control gate electrode 9 (word line WL) consisting of the polycrystalline silicon film 9A are formed, respectively. As shown in FIG. 23, each control gate electrode 9 (word line WL) has a long band-like plane pattern extending in a direction (an up-and-down direction in FIG. 23) orthogonal to a direction in which each active region L extends.

Figure 24:
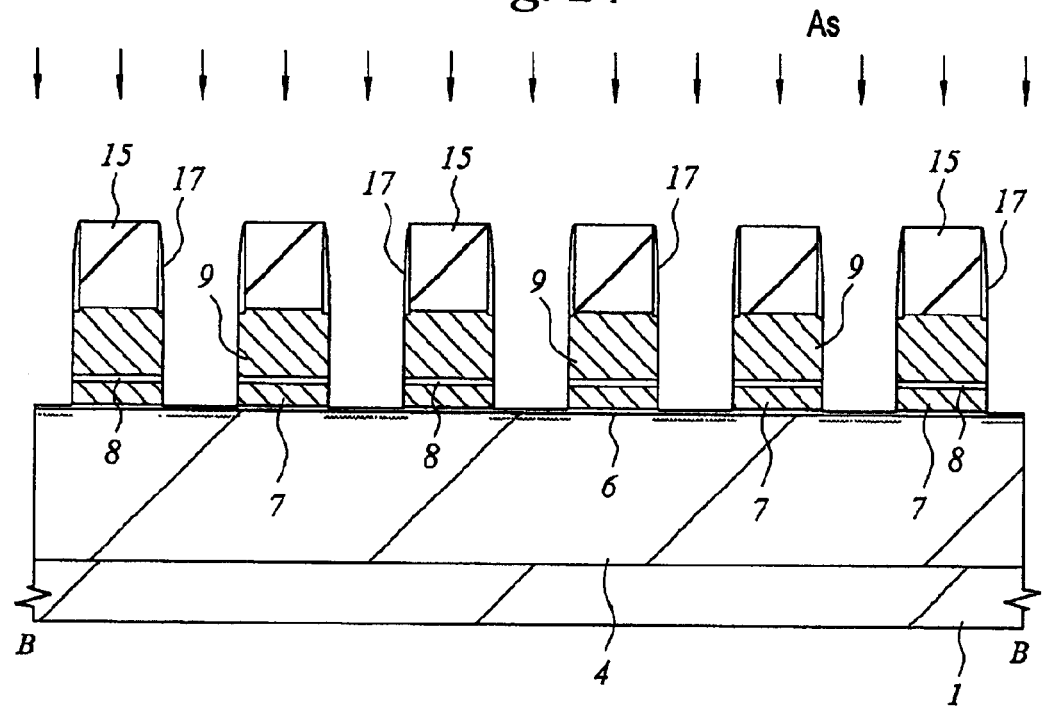
FIG. 24 is a cross-sectional view of principal parts. showing the method for manufacturing a flash memory that is the first embodiment of the present invention.
Figure 25:
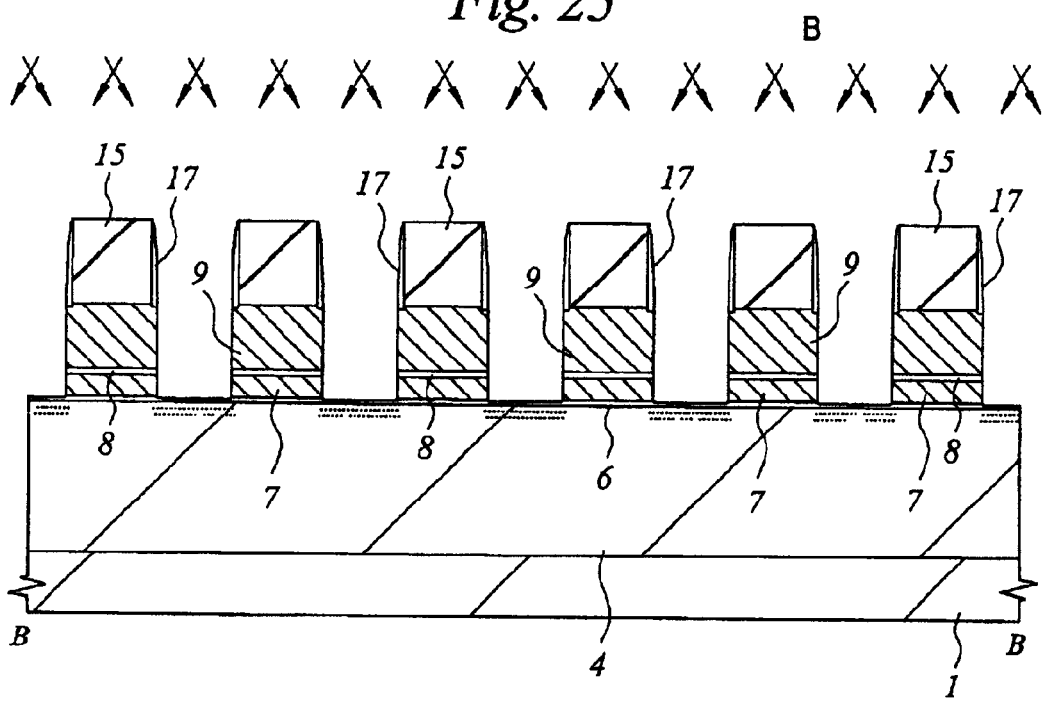
FIG. 25 is a cross-sectional view of principal parts showing the method for manufacturing a flash memory that is the first embodiment of the present invention.

Next, as shown in FIG. 24, to form the source region and the drain region of the MISFET constituting each memory cell, n-type impurities (e.g., arsenic (AS)) are ion-implanted into the p-type well 4 located in the space regions of the gate electrodes (floating gate electrode 7 and control gate electrode 9). Thereafter, as shown in FIG. 25, in order to suppress short channel effects of the MISFET constituting each memory cell, p-type impurities (boron (B)) are ion-implanted into the p-type well 4 located in the above-mentioned space regions. Ion-implantation of p-type impurities is performed in a wider region than a region in which the n-type impurities are implanted, by using an oblique ion-implantation method.

Figure 26:
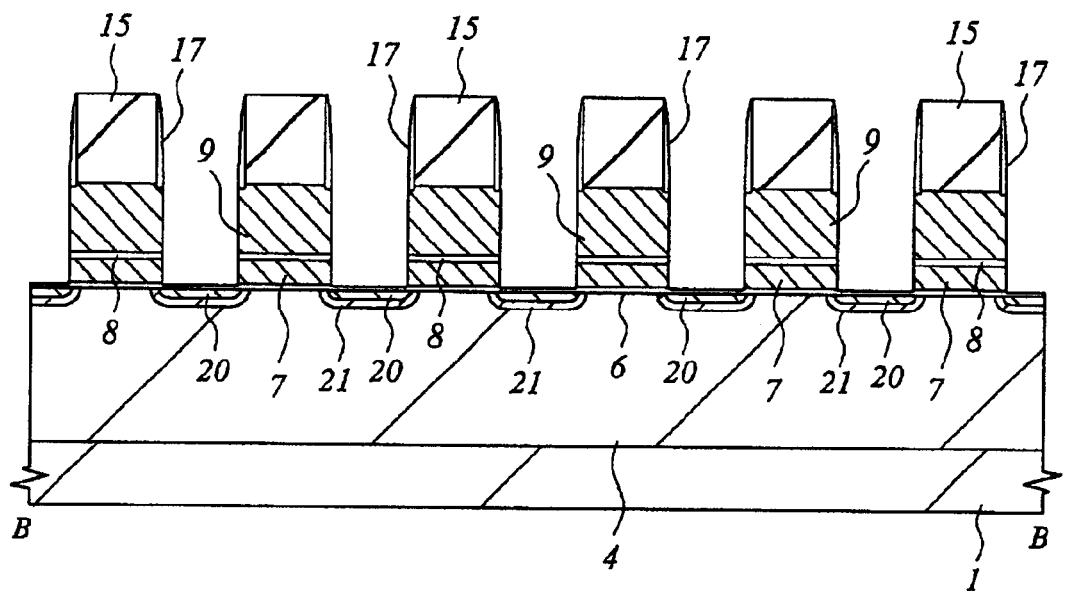
FIG. 26 is a cross-sectional view of principal parts showing the method for manufacturing a flash memory that is the first embodiment of the present invention.

Next, as shown in FIG. 26, the substrate 1 is subjected to a heat treatment at a temperature of about 900° C. to diffuse the above-stated n-type impurities and p-type impurities into the p-type well 4. Thereby, n-type impurity introduced regions 20 each constituting the source region and the drain region of the MISFET, and p-type impurity introduced regions 21 for punch-through stoppers surrounding the n-type impurity introduced regions 20 are formed, respectively.

Through the steps executed so far, damages occurring in the processing step of the gate electrode and the ion-implantation step of the impurities remain on the gate oxide film 6 in the space regions of the gate electrodes (floating gate electrode 7 and control gate electrode 9). The damages cause paths through which electrons injected into the floating gate electrode 7 leak from the end portion of the floating gate electrode 7 to the substrate 1, or the like. Thereby, quality of the gate oxide film 6 is degraded, so that it is necessary to sufficiently remove the damages.

Figure 27:
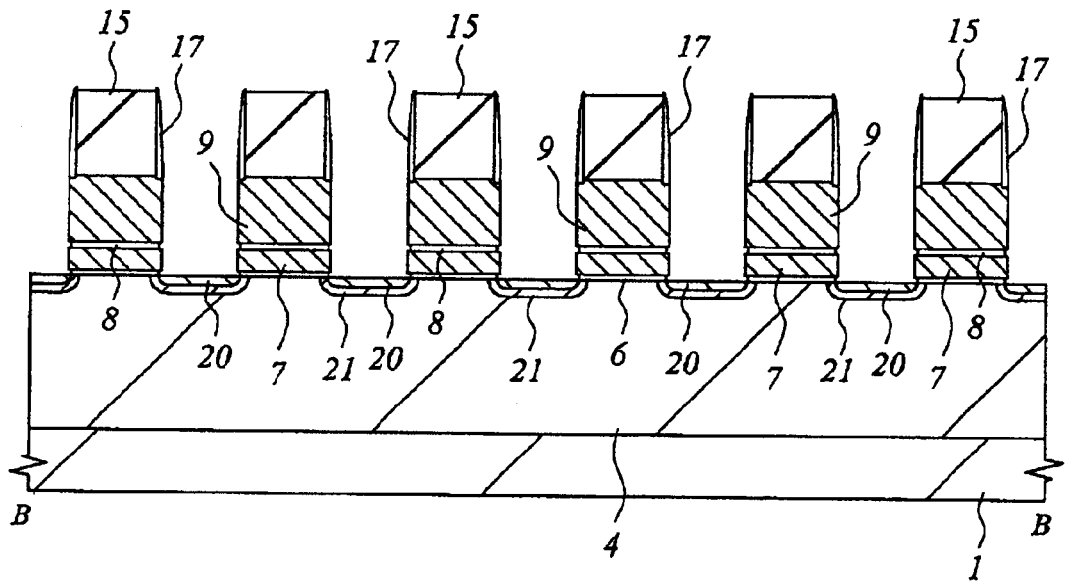
FIG. 27 is a cross-sectional view of principal parts showing the method for manufacturing a flash memory that is the first embodiment of the present invention.
Figure 28:
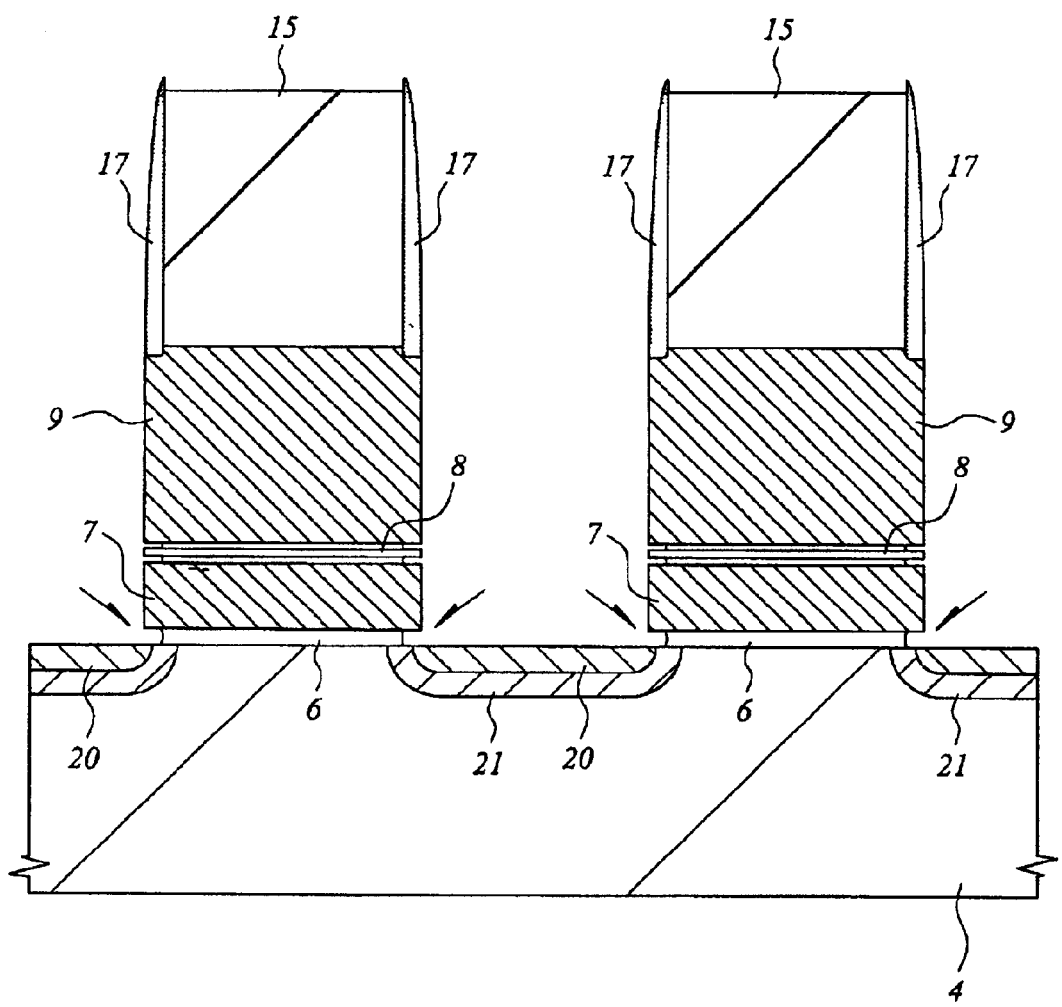
FIG. 28 is an enlarged cross-sectional view of principal parts showing the method for manufacturing a flash memory that is the first embodiment of the present invention.

Considering this, as shown in FIG. 27, the gate oxide film 6 is etched by using a hydrofluoric acid solution (HF:H$_2$O= 1:99). To sufficiently remove the damages caused in the gate oxide film 6, as shown in an enlarged view of FIG. 28, it is desirable to perform etching until the gate oxide film 6 (portions indicated by arrows) located under an end portion of the sidewall of the floating gate electrode 7 is retreated up to as much as at least a film thickness thereof.

As already stated above, in this embodiment, the etching prevention film 17 consisting of a silicon nitride film is formed on the sidewall of the silicon oxide film 15 which protects the upper portion of the control gate electrode 9. Due to this, in the etching step of removing the damages of the gate oxide film 6 as stated above, the sidewall of the silicon oxide film 15 is etched, but is not retreated in a central direction of the gate electrode.

Figure 29:
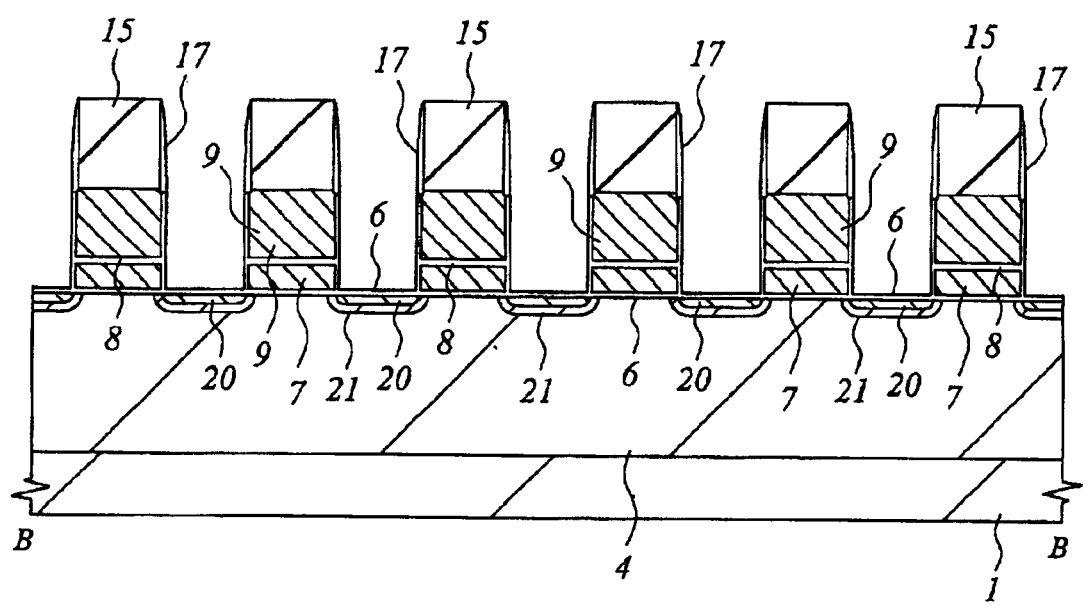
FIG. 29 is a cross-sectional view of principal parts showing the method for manufacturing a flash memory that is the first embodiment of the present invention.
Figure 30:
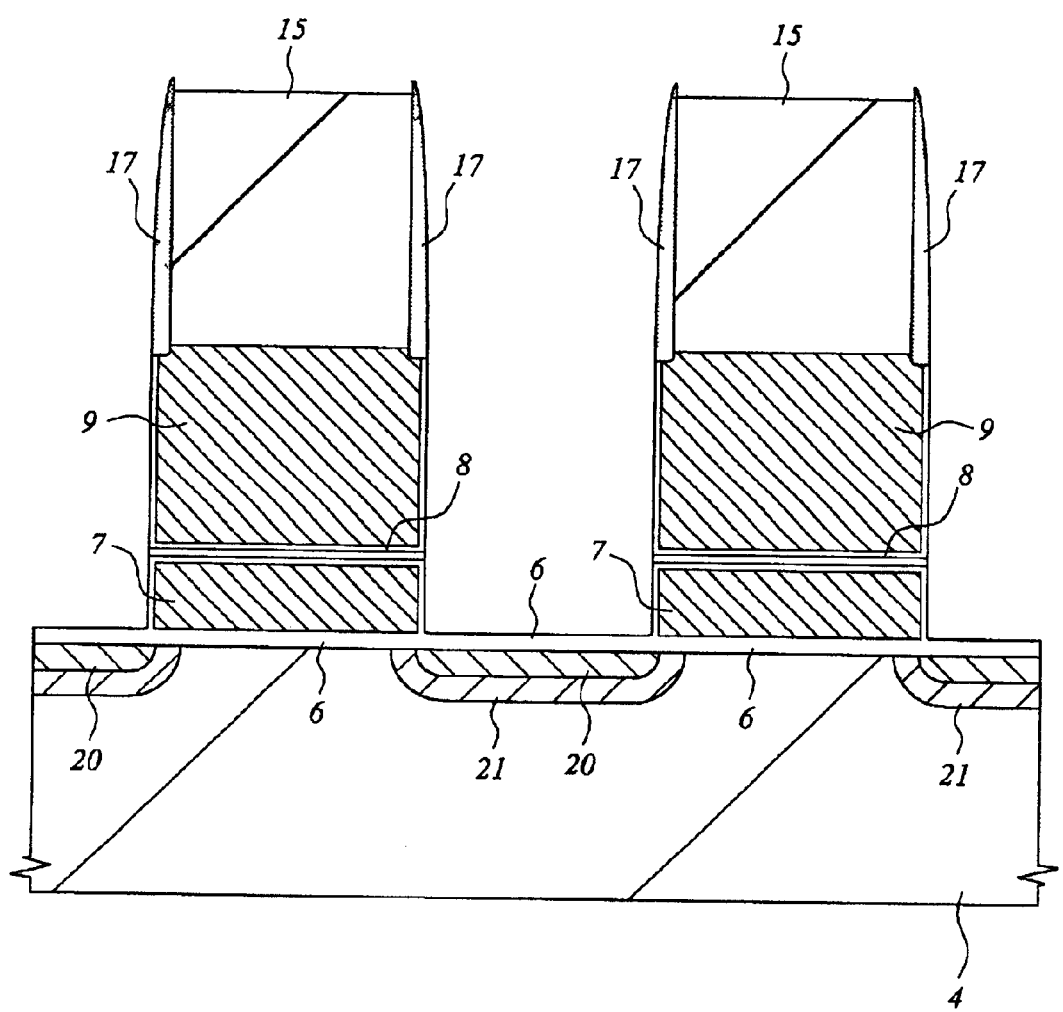
FIG. 30 is an enlarged cross-sectional view of principal parts showing the method for manufacturing a flash memory that is the first embodiment of the present invention.

Next, as shown in FIGS. 29 and 30 (an enlarged view of FIG. 29), the substrate 1 is subjected to wet oxidation at a temperature of about 850° C. By doing so, a clean, non-damage and high quality gate oxide film 6 having a thickness of about 10 nm is formed again on the space regions of the gate electrodes (floating gate electrode 7 and control gate electrode 9), i.e., on the surface of the n-type impurity introduced regions (source and drain regions) 20 and below end portions of the sidewall of the floating gate electrode 7.

Figure 31:
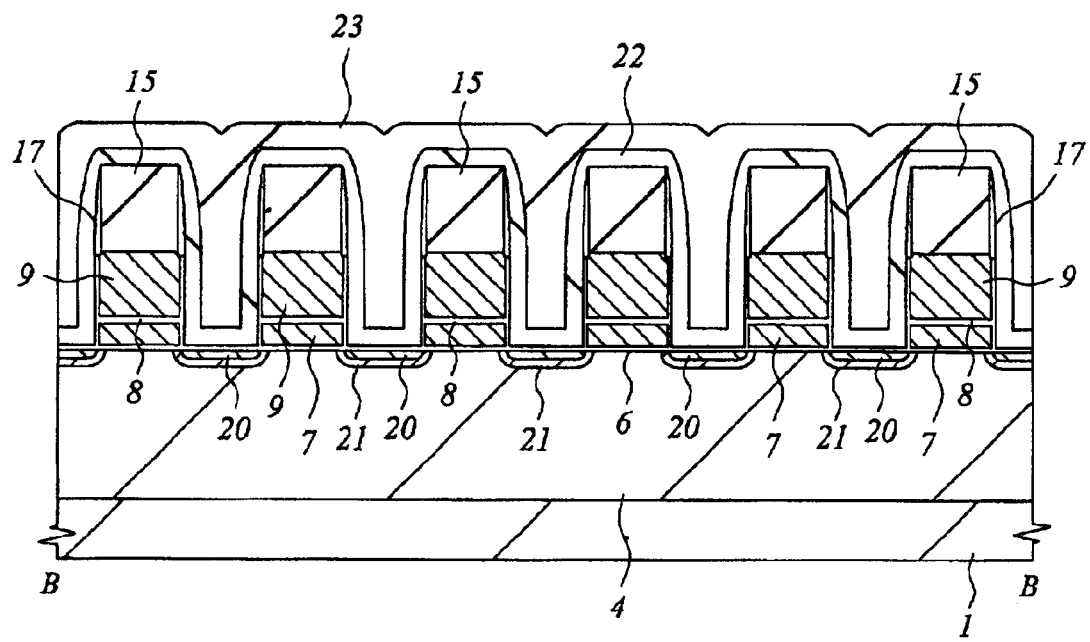
FIG. 31 is a cross-sectional view of principal parts showing the method for manufacturing a flash memory that is the first embodiment of the present invention.

Next, as shown in FIG. 31, a silicon nitride film 22 having a thickness of about 130 nm is deposited over the substrate 1 by a CVD method, and then a silicon oxide film 23 having a thickness of about 200 nm is deposited at an upper portion of the silicon nitride film 22 by a CVD method. The thickness of the silicon nitride film 22 is set to be equal to or less than half the size of each space of the gate electrodes (floating gate electrode 7 and control gate electrode 9), such that each space region is not completely embedded in the silicon nitride film 22. On the other hand, the silicon oxide film 23 is deposited so as to completely embed this space region.

Figure 32:
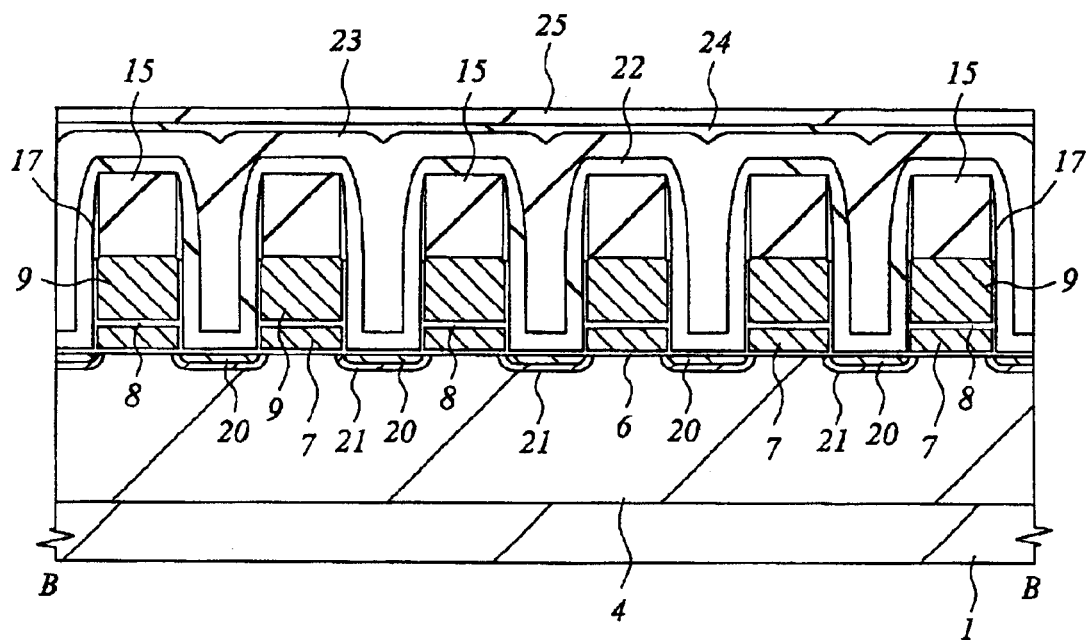
FIG. 32 is a cross-sectional view of principal parts showing the method for manufacturing a flash memory that is the first embodiment of the present invention.

Next, as shown in FIG. 32, a silicon oxide film 24 having a thickness of about 800 nm is deposited on an upper portion of the silicon oxide film 23 by a CVD method, and the silicon oxide film 24 is polished by a CMP method to flatten a surface thereof, and thereafter a silicon oxide film 25 having a thickness of about 90 nm is deposited on an upper portion of the silicon oxide film 24 by a CVD method. The polishing and flattening of the silicon nitride film 24 are performed to reduce differences in levels between the memory array and the other regions (peripheral circuit sections). Also, the silicon oxide film 25 is deposited to embed scratches generated on the surface of the silicon oxide film 24 during the above-stated polishing step.

Figure 33:
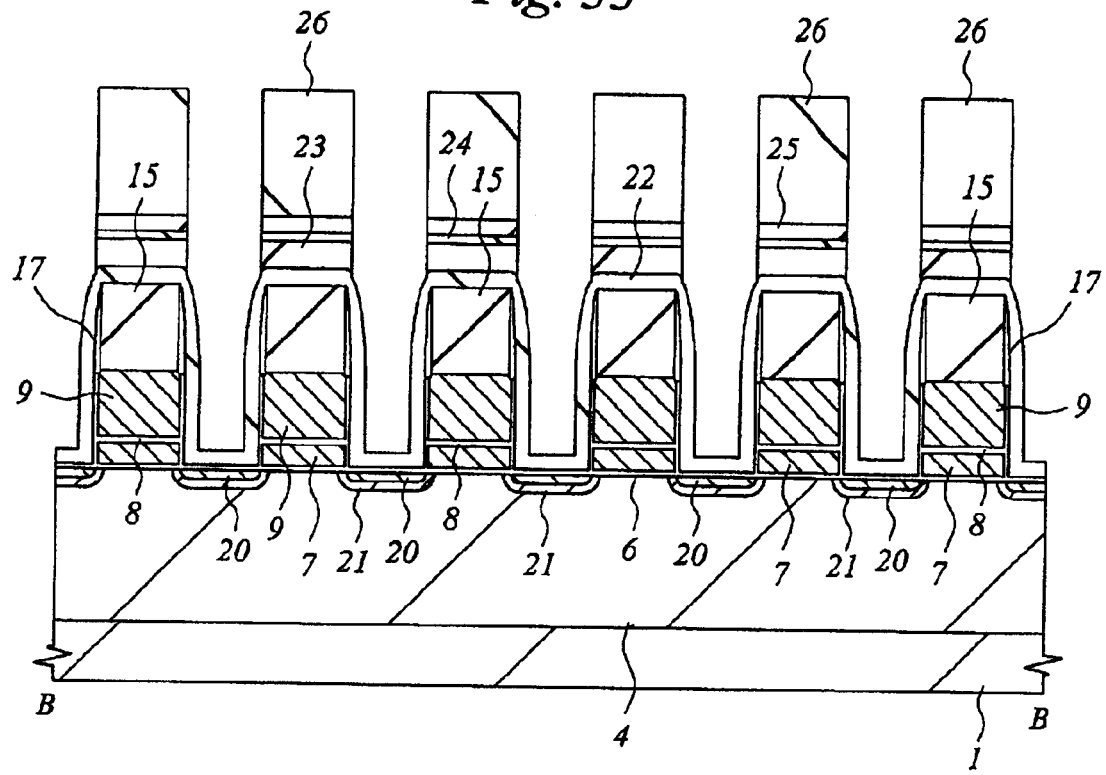
FIG. 33 is a cross-sectional view of principal parts showing the method for manufacturing a flash memory that is the first embodiment of the present invention.

Next, as shown in FIG. 33, by using, as a mask, a photoresist film 26 formed on the upper portion of the silicon oxide film 25, the silicon oxide films 25, 24 and 23 in the space regions of the gate electrodes (floating gate electrode 7 and control gate electrode 9) are subjected to dry etching. This etching is performed under the condition that the etching selectivity of silicon oxide to silicon nitride is increased. When a surface of the silicon nitride film 22 is exposed, the etching operation is stopped.

Figure 34:
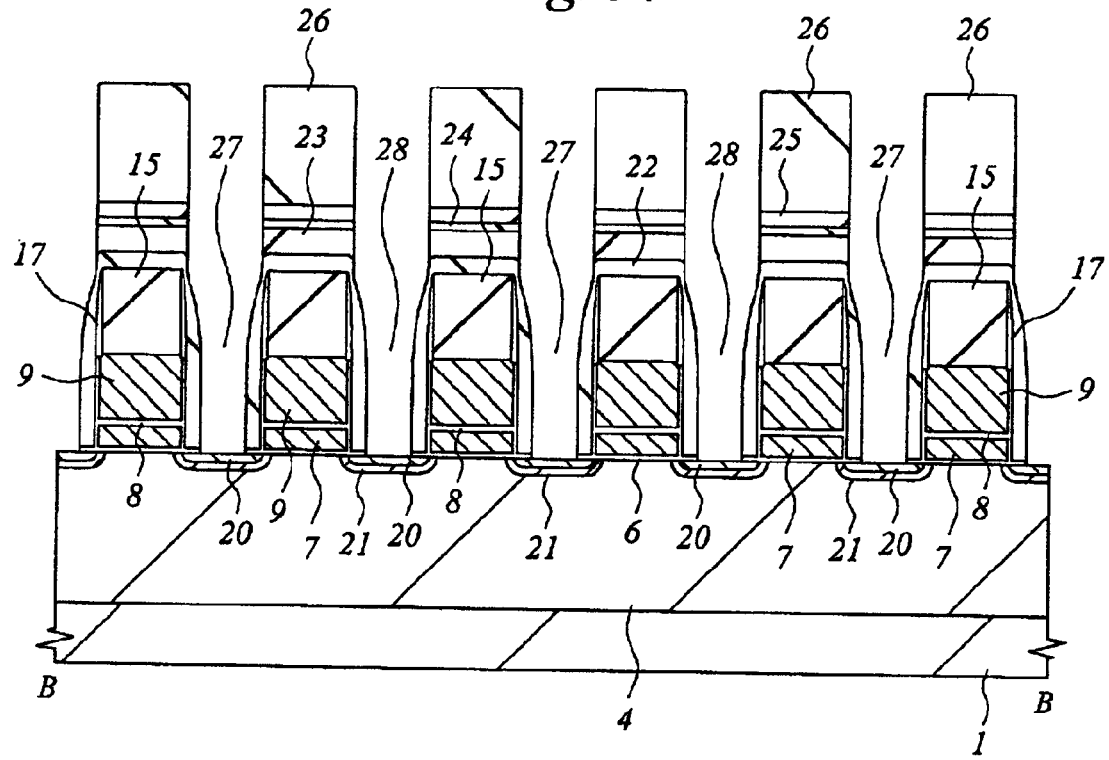
FIG. 34 is a cross-sectional view of principal parts showing the method for manufacturing a flash memory that is the first embodiment of the present invention.

Next, as shown in FIG. 34, the silicon nitride film 22 and the thin gate oxide film 6, which is a lower layer thereof, in the space regions of the gate electrodes (floating gate electrode 7 and control gate electrode 9) are subjected to dry etching, and thereby contact holes 27 and 28 are formed in which the surfaces of the n-type impurity introduced regions (source and drain regions) 20 are exposed. The silicon nitride film 22 is etched by an anisotropic etching method such that the silicon nitride film 22 remains on each sidewall of the gate electrodes (floating gate electrode 7 and control gate electrode 9). By doing so, it is possible to form the contact holes 27 and 28 by a self-alignment relative to the gate electrodes (floating gate electrode 7 and control gate electrode 9).

Figure 35:
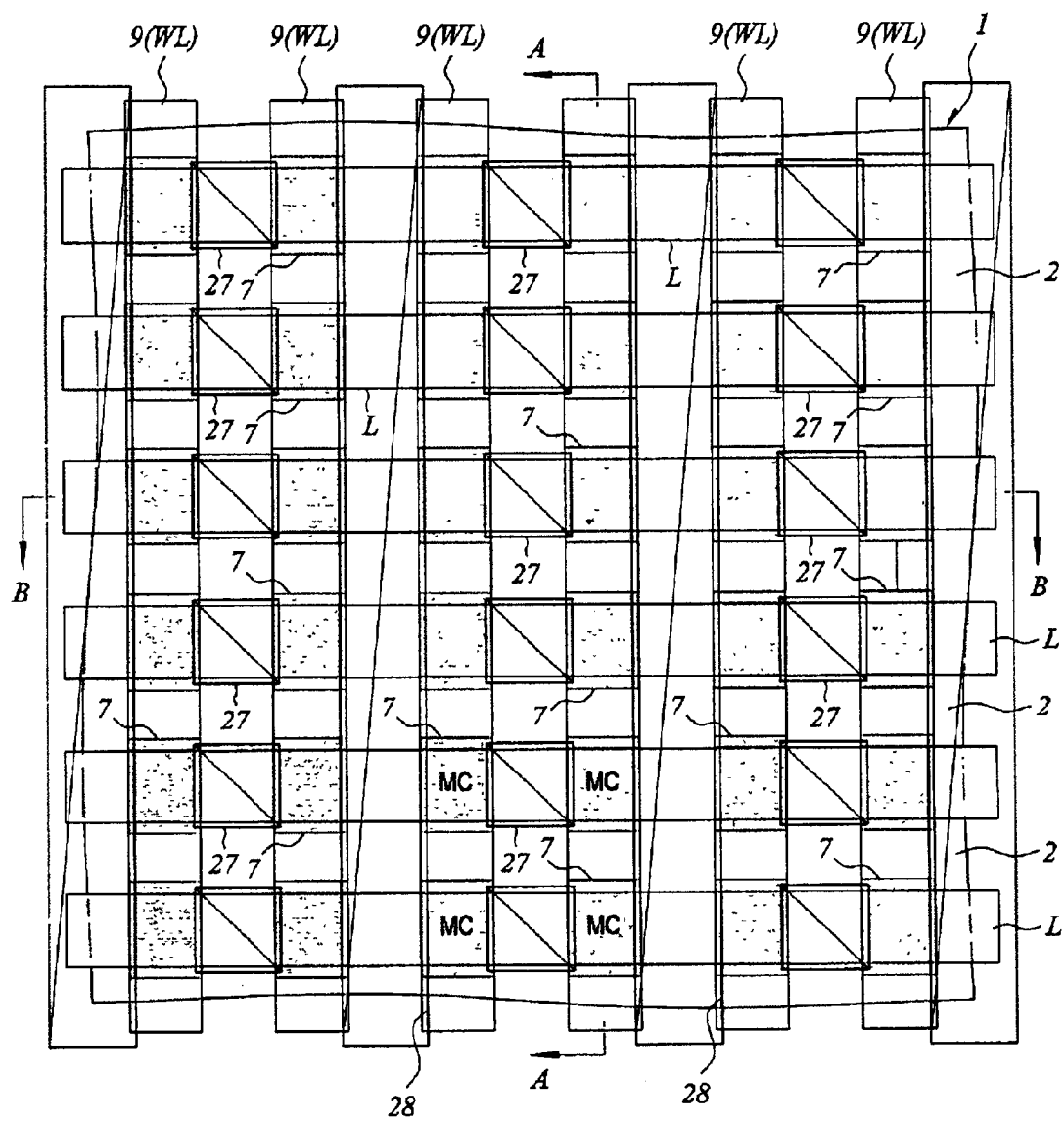
FIG. 35 is a plan view of principal parts showing the method for manufacturing a flash memory that is the first embodiment of the present invention.

FIG. 35 shows a plane pattern of the contact holes 27 and 28. As shown in FIG. 35, each of the contact holes 27 formed on the upper portions of one (drain region) of the n-type impurity introduced regions (source and drain region) 20 has a hole-shaped pattern separated per active region L. Namely, each of the contact holes 27 is formed at a rate of one between two MISFETs (memory cells MC) adjacent to each other in each extending direction of the active regions L.

On the other hand, the contact holes 28 formed at the upper portions of the other region (source region) of the n-type impurity introduced regions (source and drain regions) 20 are arranged to have long band-like plane patterns extending along extending directions of the control gate electrodes 9 (word lines WL). Namely, the contact holes 28 are ones common to many MISFETs (memory cells MC) extending along the extending directions of the control gate electrodes 9 (word lines WL).

Figure 36:
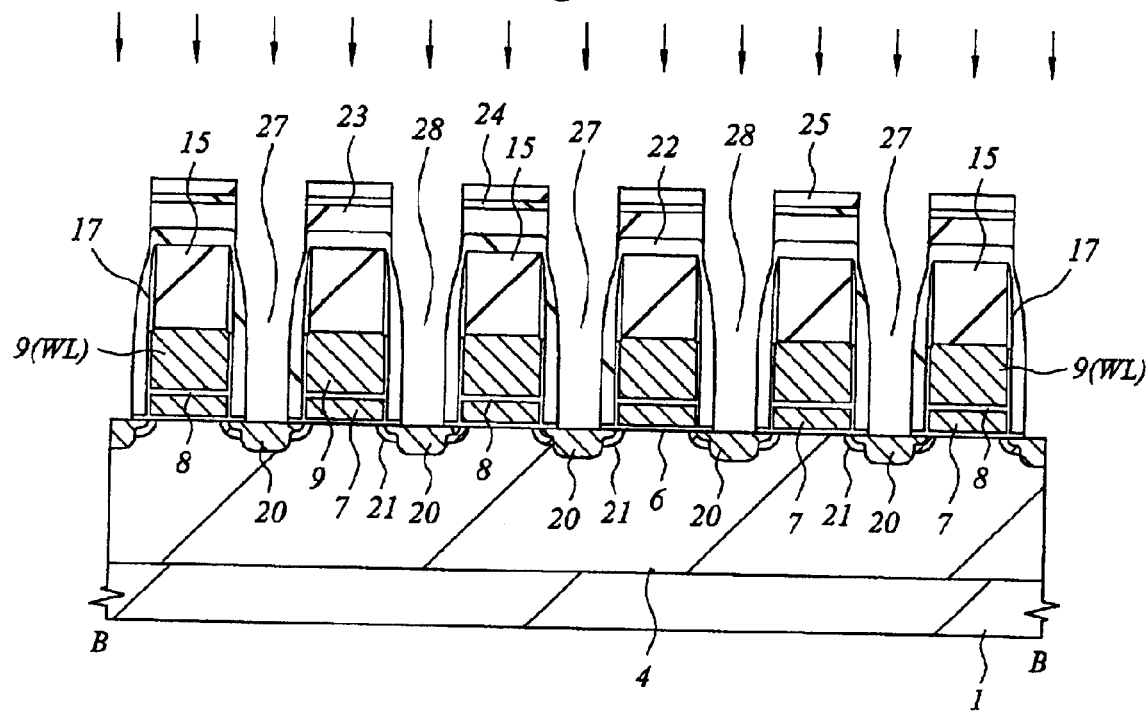
FIG. 36 is a cross-sectional view of principal parts showing the method for manufacturing a flash memory that is the first embodiment of the present invention.

Next, as shown in FIG. 36, n-type impurities (P or As) are ion-implanted into the n-type impurity introduced regions (source and drain regions) 20 through the contact holes 27 and 28, and thereby the n-type impurity introduced regions (source and drain regions) 20 are decreased in resistance. This ion implantation is performed in order to reduce each contact resistance between plugs 30 formed in the contact holes 27 and 28 in a later step and the n-type impurity introduced regions (source and drain regions) 20.

Figure 37:
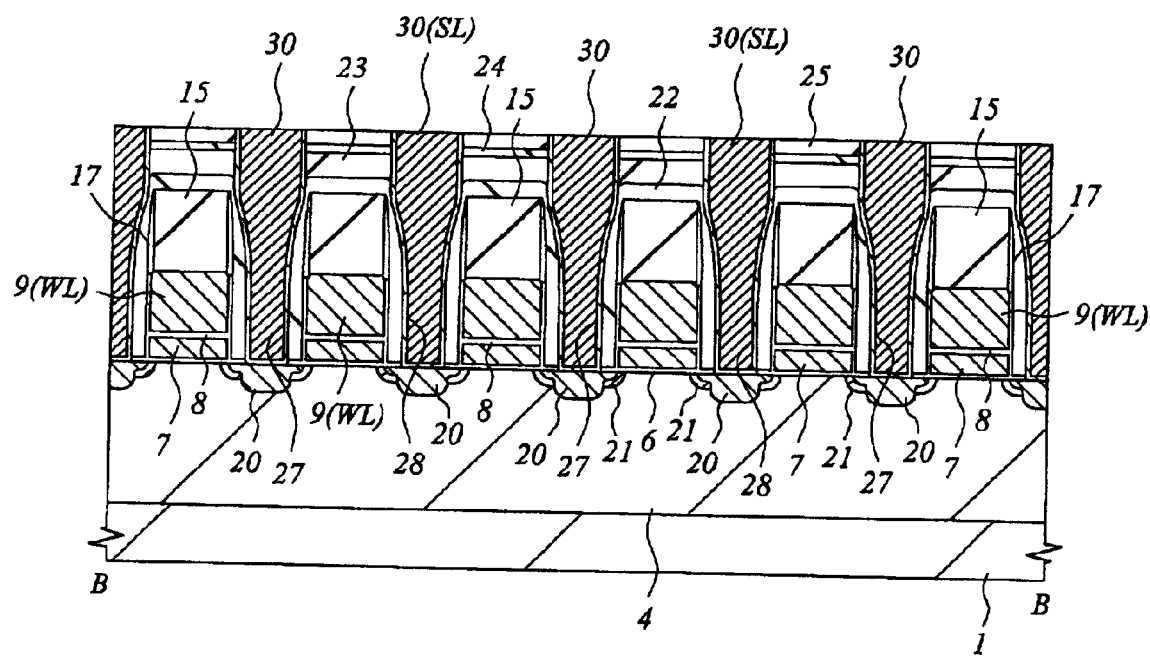
FIG. 37 is a cross-sectional view of principal parts showing the method for manufacturing a flash memory that is the first embodiment of the present invention.

Next, as shown in FIG. 37, the plugs 30 are formed in the contact holes 27 and 28, respectively. To form the plugs 30, for example, a Ti film having a thickness of about 10 nm and a TiN film having a thickness of about 80 nm are deposited on the silicon oxide film 25 and inside the contact holes 27 and 28 by a sputtering method. Subsequently, a W film having a thickness of about 350 nm is deposited on an upper portion of the TiN film by a CVD method. Thereafter, the Ti film, the TiN film and the W film outside the contact holes 27 and 28 are removed by a CMP method. The plugs 30 formed in the contact holes 28 located on upper portions of the source regions constitute source lines SL common to many MISFETs (memory cells MC) along the extending directions of the control gate electrodes 9 (word lines WL).

Figure 38:
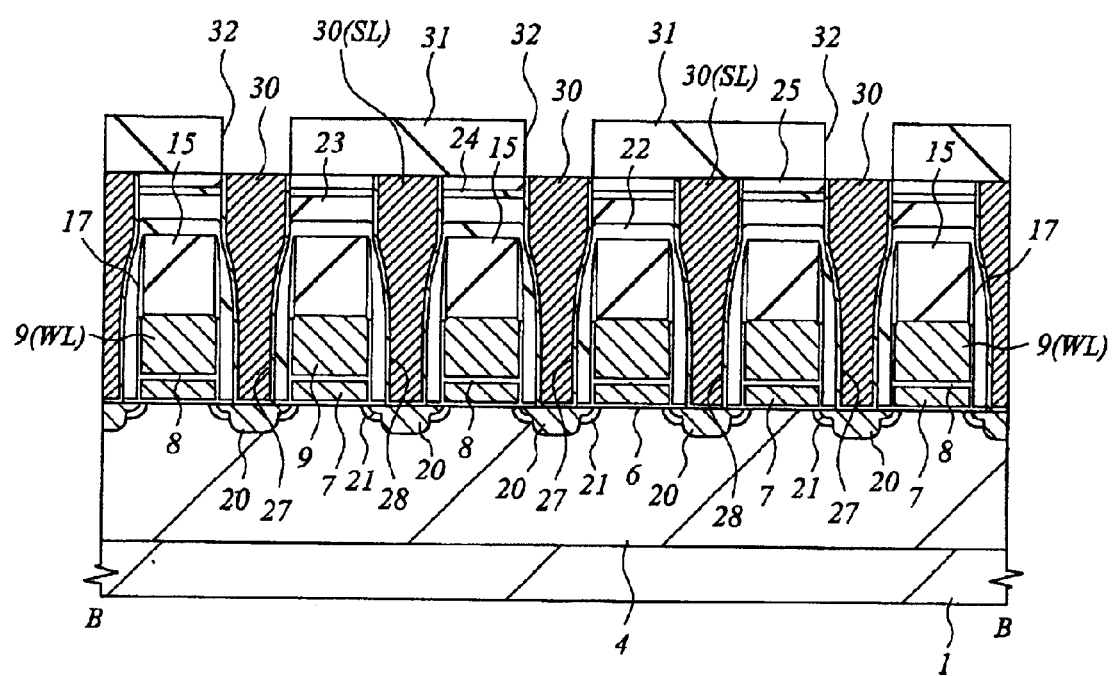
FIG. 38 is a cross-sectional view of principal parts showing the method for manufacturing a flash memory that is the first embodiment of the present invention.

Next, as shown in FIG. 38, after a silicon oxide film 31 having a thickness of about 30 nm is deposited on the upper portion of the silicon oxide film 25 by a CVD method, silicon oxide film 31 on the upper portions of the contact holes 27 is removed by dry etching using a photoresist film as a mask, and thereby through holes 32 are formed to expose each surface of the plugs 30.

Thereafter, a W film having a thickness of about 350 nm is deposited on the silicon oxide film 31 and inside the through holes 32 by a sputtering method and a CVD method. Subsequently, the W film is patterned by dry etching using a photoresist film as a mask to form data lines (DL), and thereby the memory cells MC shown in FIGS. 2 to 4 are nearly completed. Then, Al (Aluminum) wirings composed of about two layers are formed on upper portions of the data lines (DL) through an interlayer insulating film, but each figure of the Al wirings is omitted.

According to the present embodiment, it is possible to achieve fine processing using the SAC technology without degeneration of characteristics of the MISFET constituting each memory cell MC. Thereby, it is possible to promote mass storage and a fine structure of each NOR type flash memory.

(Second Embodiment)

Figure 39:
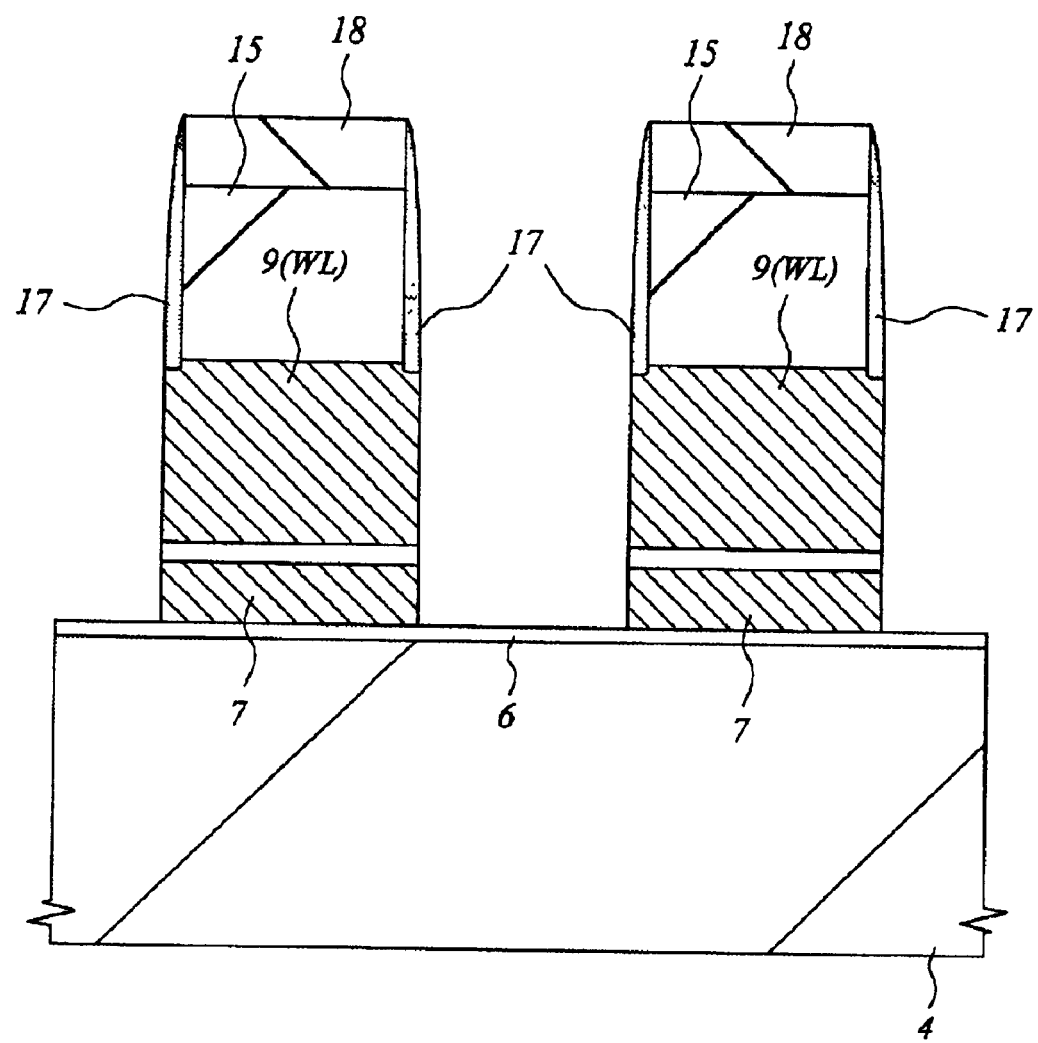
FIG. 39 is an enlarged cross-sectional view of principal parts showing a flash memory that is another embodiment of the present invention.

In the first embodiment mentioned above, the insulating film which protects the upper portion of each control gate electrode 9 is constituted only by the silicon oxide film 15 in order to suppress generation of crystal defects in the gate oxide film 6 of the MISFET constituting each memory cell MC. In this embodiment, as shown in FIG. 39, a protection insulating film on each control gate electrode 9 is constituted by a silicon oxide film 15 and a silicon nitride film 18 deposited on each upper portion thereof.

Figure 40:
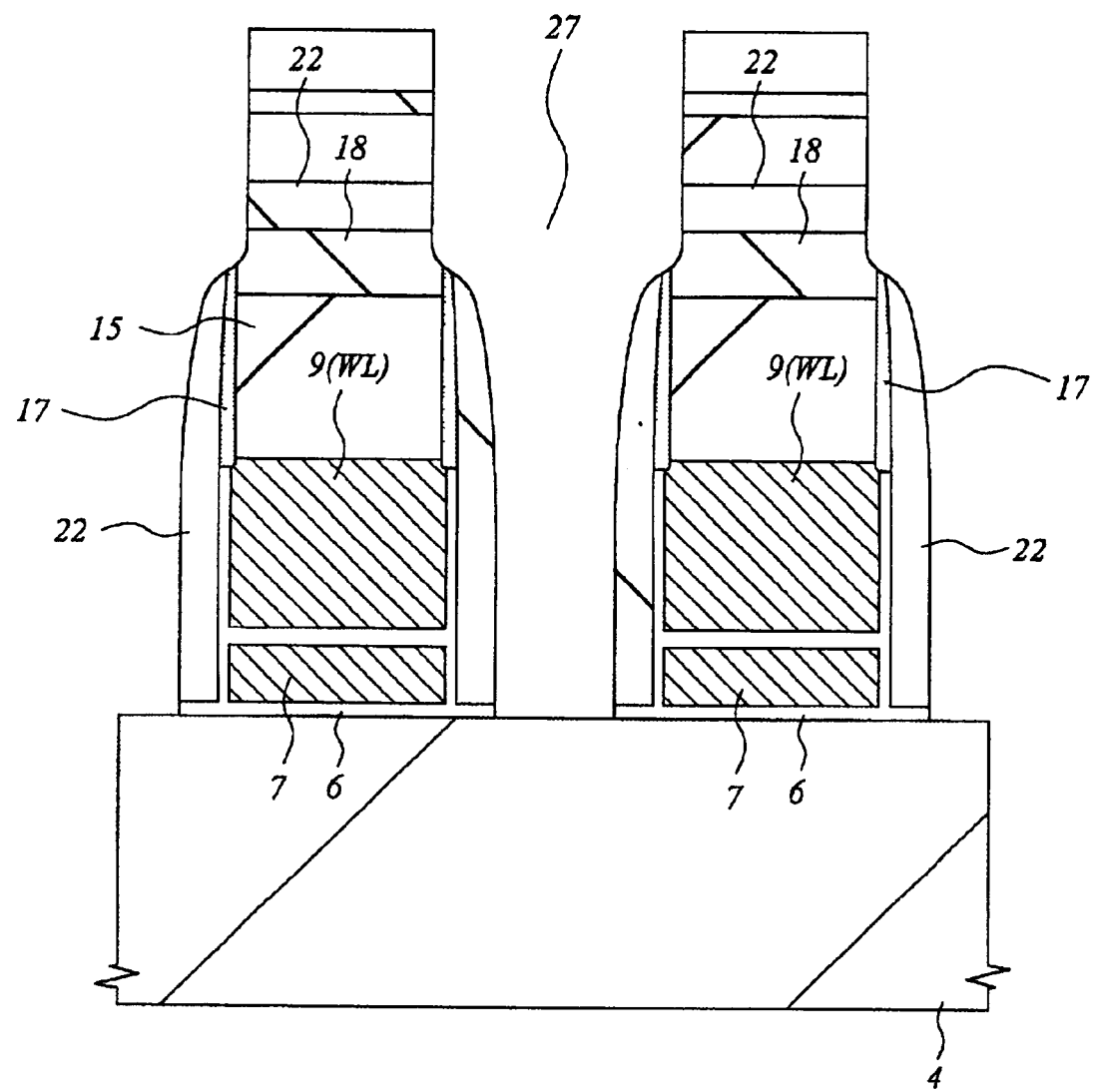
FIG. 40 is an enlarged cross-sectional view of principal parts showing a flash memory that is another embodiment of the present invention.

By constituting so, it is possible to achieve fine structure of each memory cell MC in size and to reduce respective spaces between the adjacent memory cells MC. Therefore, as shown in FIG. 40, even if each radius of the contact holes 27 (28) is relatively larger than each space, it is possible to prevent such drawbacks that the silicon oxide film 15 on each control gate electrode 9 is deeply cut by etching when the contact holes 27 (28) are formed. Even in this case, it is desired to minimize a film thickness of the silicon nitride film 18 in order to suppress generation of crystal defects in the gate oxide film 6.

Further, even in this case, since an etching prevention film 17 composed of a silicon nitride film is formed on each sidewall of a protection insulating film (silicon oxide film 15 and silicon nitride film 18), it is possible to prevent such drawbacks that the sidewall of the silicon oxide film 15 is etched by the hydrofluoric acid cleaning step mentioned above and is thereby retreated.

Figure 41:
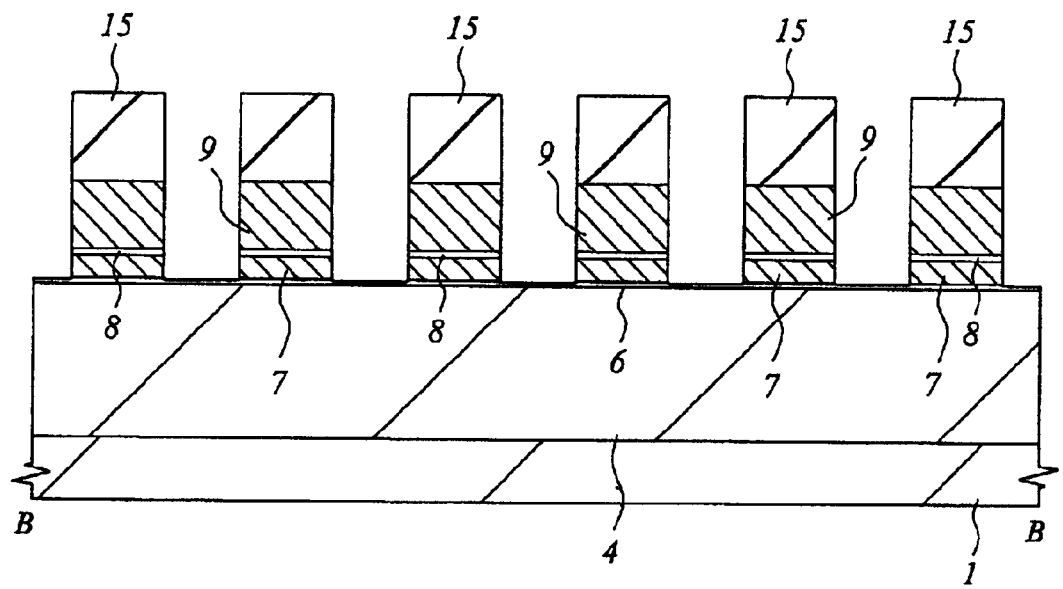
FIG. 41 is a cross-sectional view of principal parts showing a flash memory that is another embodiment of the present invention.
Figure 42:
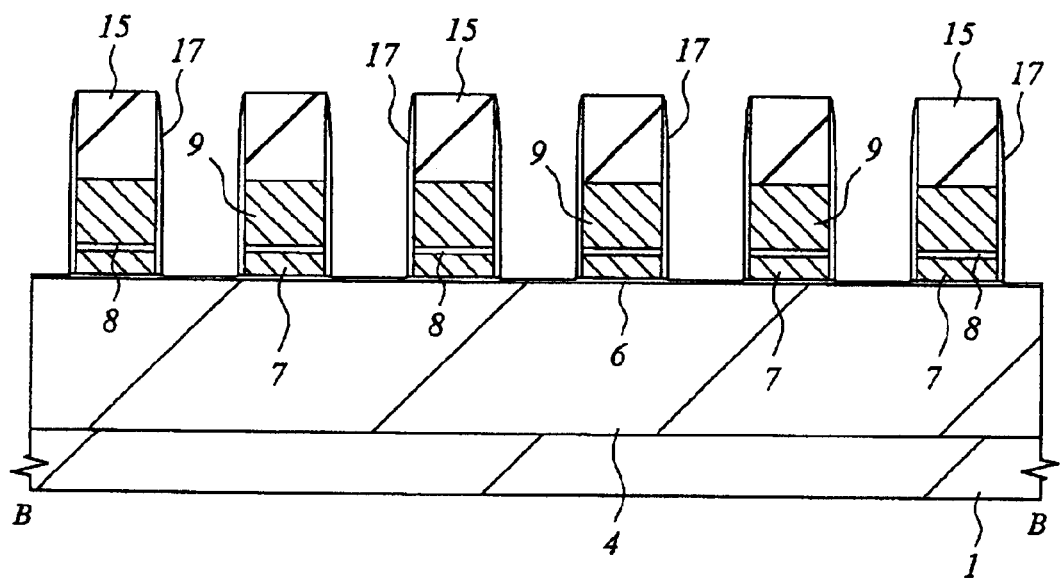
FIG. 42 is a cross-sectional view of principal parts showing a flash memory that is another embodiment of the present invention.

Furthermore, in the first embodiment described above, as shown in FIGS. 18 to 22, the silicon oxide film 15 is subjected to dry etching to expose parts of the polycrystalline silicon film 9A. Thereafter, the etching prevention film 17 is formed on each sidewall of the silicon oxide film 15. Then, the silicon oxide film 15, on each sidewall of which the etching prevention film 17 is formed, is used as a mask to perform sequentially dry etching of the polycrystalline silicon film 9A, the ONO film 8 and the polycrystalline silicon film 7B. On the other hand, as shown in FIGS. 41 and 42, the silicon oxide film 15 is used as a mask to perform dry etching of the polycrystalline silicon film 9A, the ONO film 8 and the polycrystalline silicon film 7B, and thereafter the etching prevention film 17 may be formed on each sidewall thereof. Even in this case, it is possible to prevent such drawbacks that the sidewall of the silicon oxide film 15 is etched by the above-mentioned hydrofluoric acid cleaning step and is retreated.

As described above, the inventions made by the present inventors have been concretely described on the basis of the above-mentions embodiments. However, needless to say, the present invention is not limited to the above-mentioned embodiments and various changes and modifications thereof may be made without departing from the gist thereof.

Figure 43:
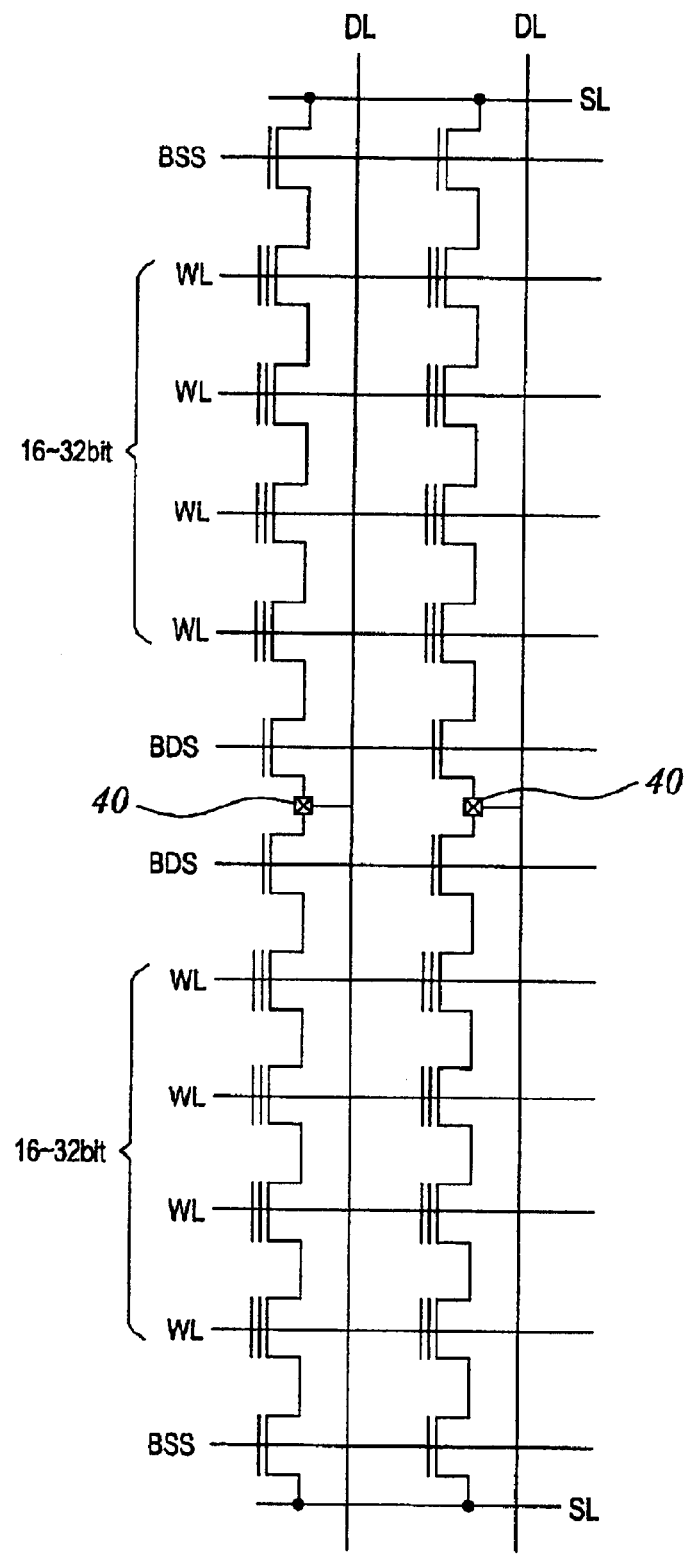
FIG. 43 is a schematic circuit diagram of an NAND type flash memory that is another embodiment of the present invention.
Figure 44:
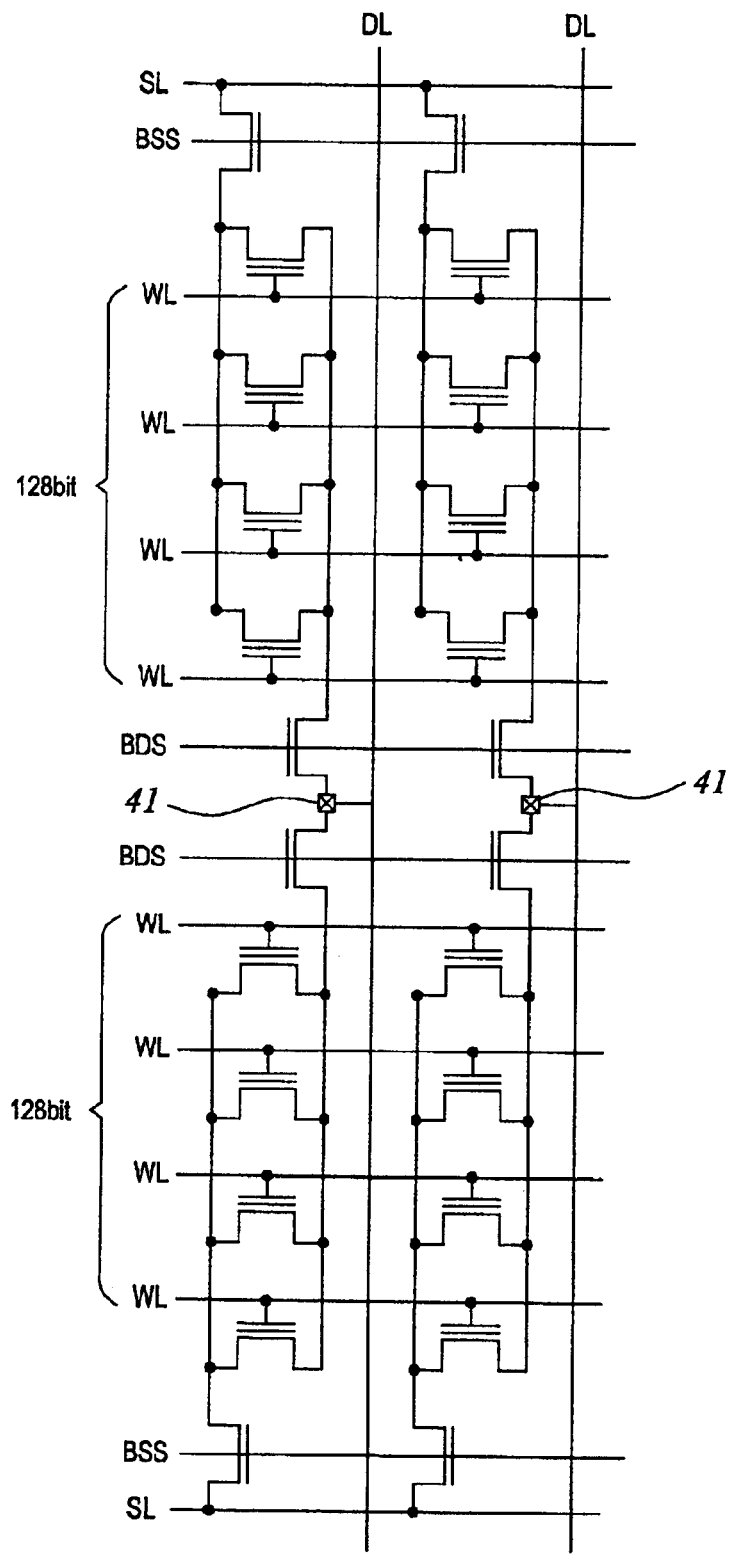
FIG. 44 is a schematic circuit diagram of an AND type flash memory that is another embodiment of the present invention.
Figure 45:
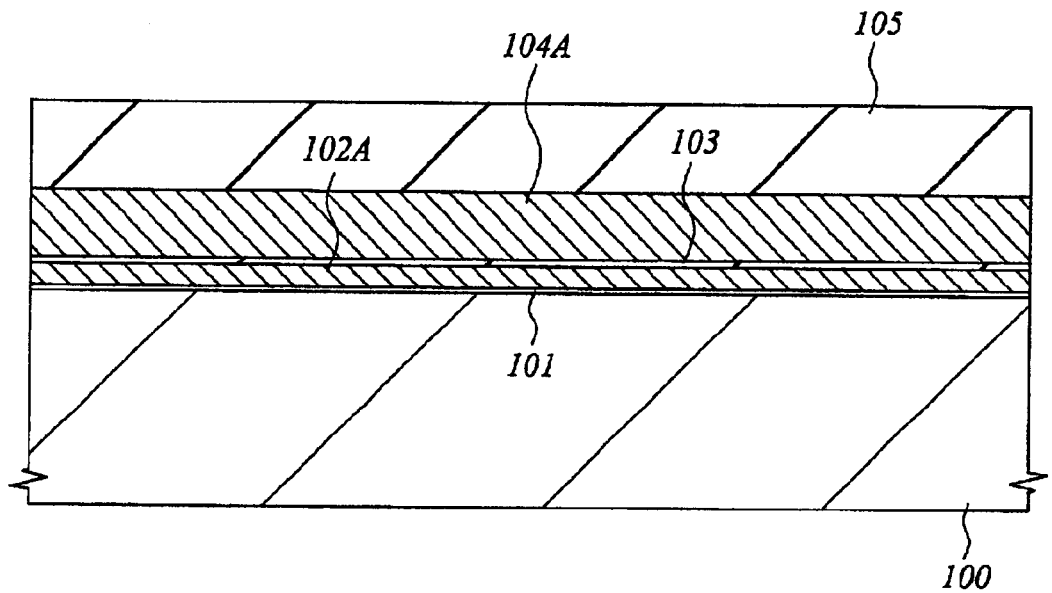
FIG. 45 is a cross-sectional view for explaining problems that the inventors of the present invention have considered.
Figure 46:
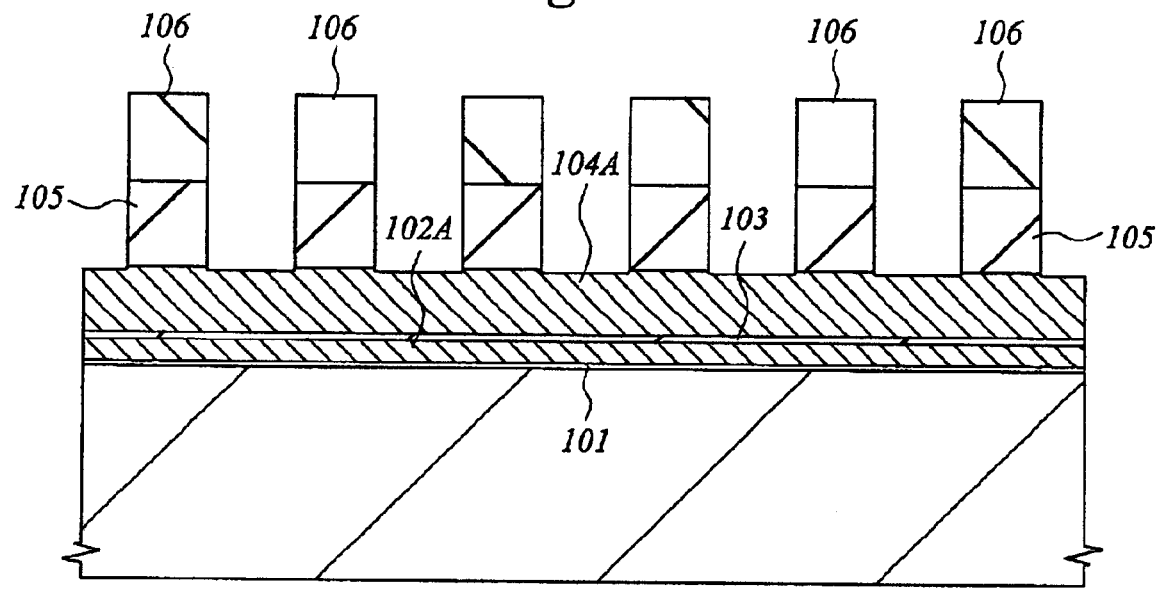
FIG. 46 is a cross-sectional view for explaining problems that the inventors of the present invention have considered.
Figure 47:
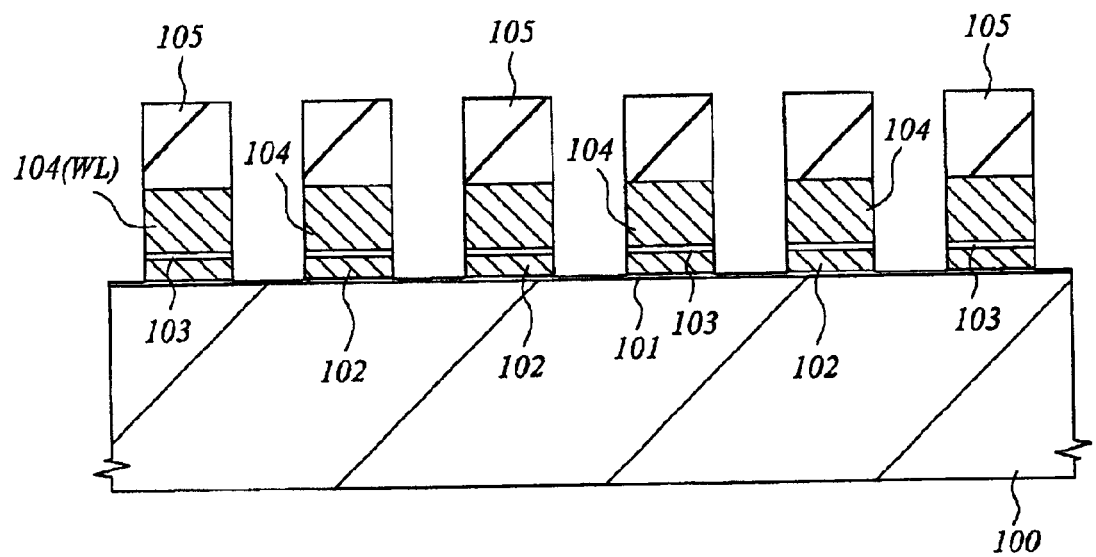
FIG. 47 is a cross-sectional view for explaining problems that the inventors of the present invention have considered.
Figure 48:
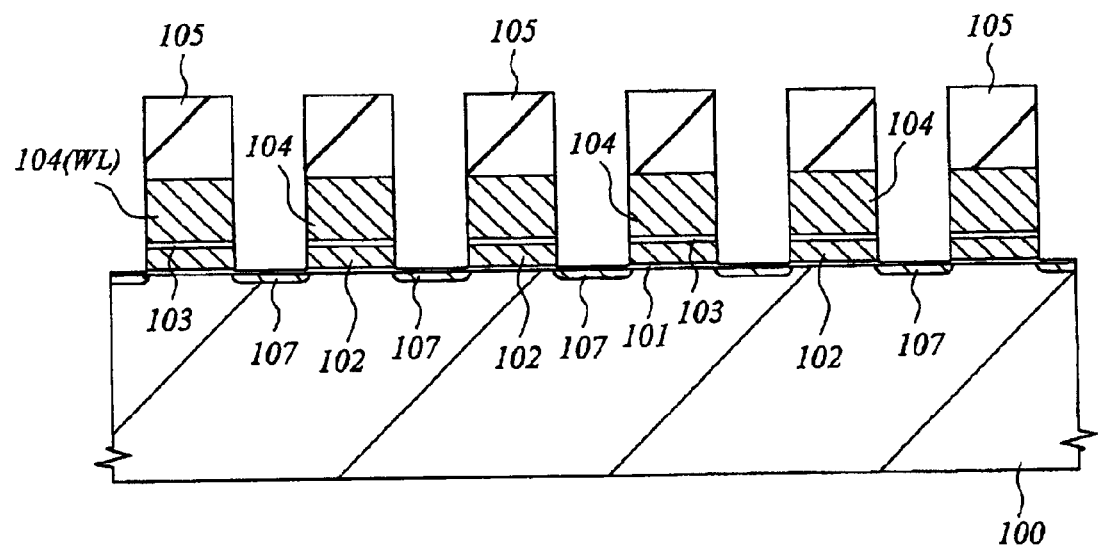
FIG. 48 is a cross-sectional view for explaining problems that the inventors of the present invention have considered.
Figure 49:
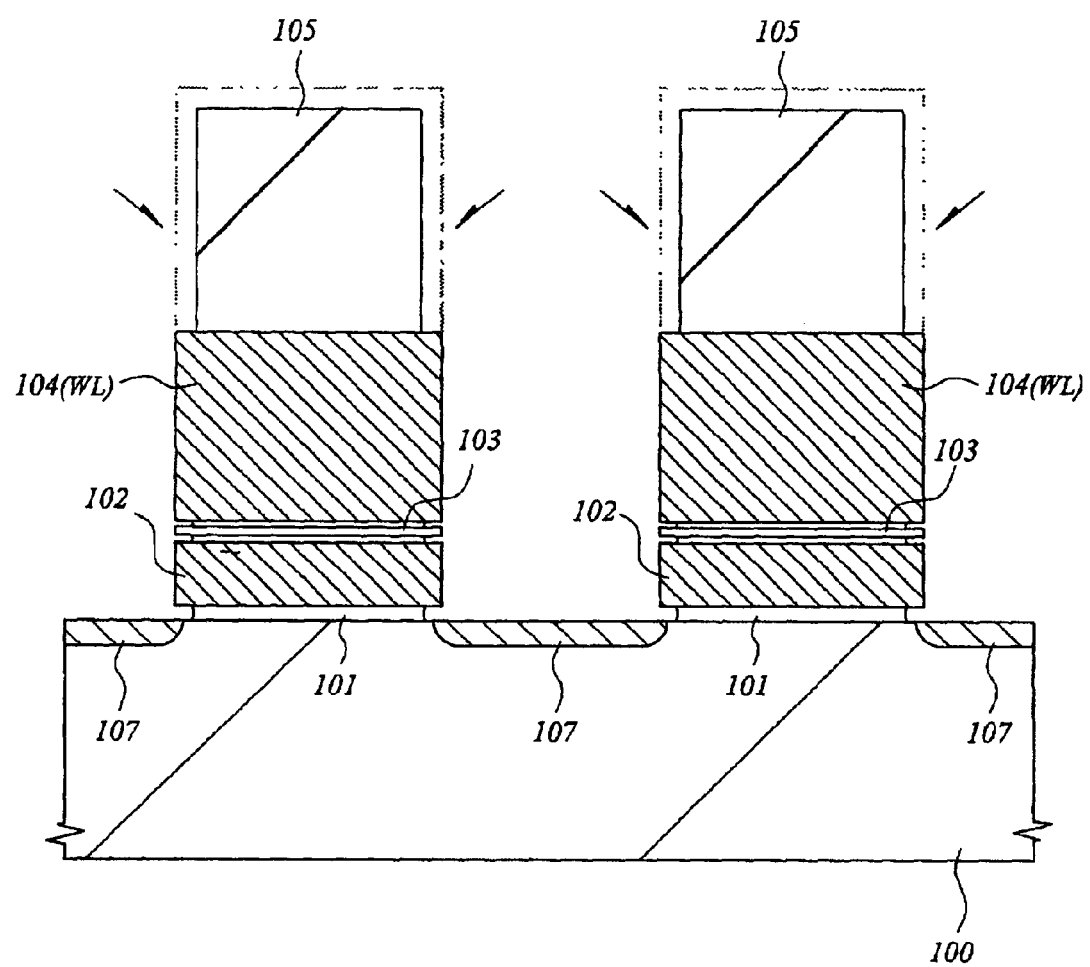
FIG. 49 is an enlarged cross-sectional view for explaining problems that the inventors of the present invention have considered.
Figure 50:
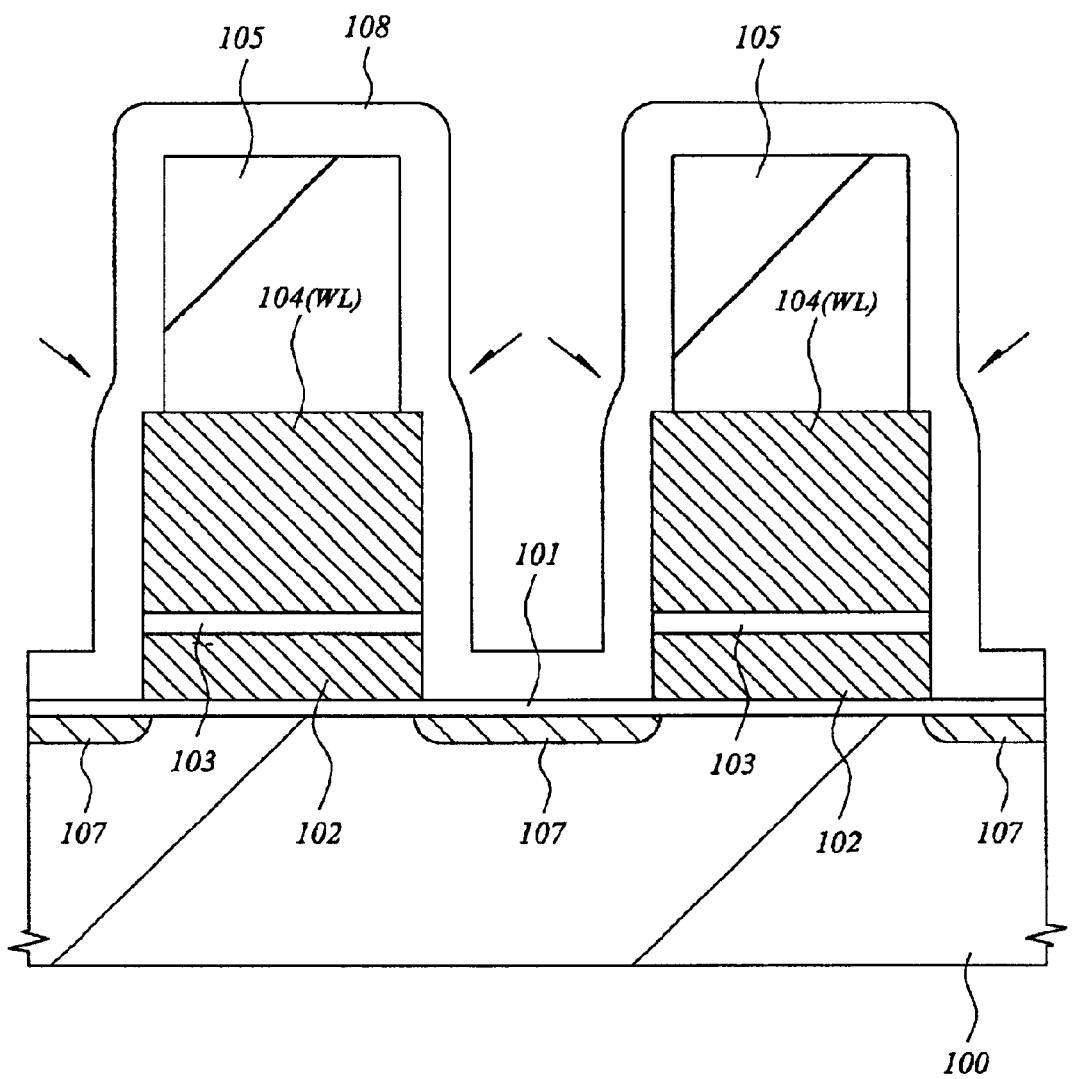
FIG. 50 is an enlarged cross-sectional view for explaining problems that the inventors of the present invention have considered.

In the above-mentioned embodiments, description has been given to the case where the present invention is applied to the NOR type flash memory. However, the present invention is not limited to the NOR type flash memory. For example, the present invention is also applicable to other flash memory constituting each memory cell formed by a MISFET having a two-layer gate structure of a floating gate electrode and a control gate electrode. Namely, as shown in FIG. 43, the present invention can be applied to the case where each contact hole 40 connecting a drain region of each selected MISFET (BDS) of an NAND type flash memory to each data line DL is formed in a self-aligned manner. Or, as shown in FIG. 44, the present invention can be applied to the case where each contact hole 41 connecting a drain region of each selected MISFET (BDS) of an AND type flash memory to each data line DL is formed in a self-aligned manner. Thereby, it is possible to promote mass storages and fine structures of each NAND type flash memory and each AND type flash memory.

Of inventions disclosed by the present application, effects obtained by the typical inventions will be briefly described as follows.

According to the present invention, it is possible to achieve realization of fine processing using the SAC technique without degeneration of characteristics of the MISFET constituting each memory cell.

According to the present invention, it is possible to promote mass storage and a fine structure of the flash memory.

What is claimed is:

1. A method for manufacturing a semiconductor integrated circuit device including a MIS transistor structure, the method comprising the steps of:
   (a) forming a first gate insulating film for forming the MIS transistor structure on a main surface of a semiconductor substrate;
   (b) forming at least one pair of laminated structure bodies each including two layers of a first gate electrode covering a part of said first gate insulating film and a first insulating film covering said first gate electrode, an etching prevention film being formed on a sidewall portion of said first insulating film but so as not to cover sidewall portions of said first gate electrode;
   (c) introducing impurities into said semiconductor substrate through said first gate insulating film located in a region not covered with said laminated structure bodies, and thereby forming a first impurity introduced region self-aligned with said laminated structure bodies on the main surface of said semiconductor substrate;
   (d) removing said first gate insulating film in the region not covered with said laminated structure bodies after said step (c); and
   (e) forming a second insulating film covering upper portions and sidewall portions of said laminated structure bodies after said step (d).

2. The method for manufacturing a semiconductor integrated circuit device according to claim 1, further comprising a step of:
   (d-2) oxidizing the main surface of said semiconductor substrate in a region from which said first gate insulating film is removed, and thereby forming an insulating film on said main surface, between said steps (d) and (e).

3. The method for manufacturing a semiconductor integrated circuit device according to claim 2, further comprising the steps of:
   (f) forming a third insulating film over said second insulating film so as to cover said laminated structure bodies covered with said second insulating film and to embed each space between said laminated structure bodies; and
   (g) forming a mask for a contact hole over said third insulating film, and selectively removing said third insulating film and said second insulating film in a laminating direction thereof by anisotropic etching using said mask, and thereby forming the contact hole which penetrates said third insulating film and said second insulating film and which reaches a surface of said first impurity introduced region.

4. The method for manufacturing a semiconductor integrated circuit device according to claim 3, further comprising a step of:
   (h) forming a wiring conductive layer embedding said contact hole and electrically connected to said first impurity introduced region, after said step (g).

5. The method for manufacturing a semiconductor integrated circuit device according to claim 4,
   wherein a second gate insulating film and a second gate electrode laminated on an upper portion thereof are interposed between said first gate electrode and said first insulating film of each of said laminated structure bodies.

6. The method for manufacturing a semiconductor integrated circuit device according to claim 4,
   wherein said first insulating film includes a silicon oxide film, said first gate insulating film and said third insulating film each include a silicon oxide film, and said etching prevention film and said second insulating film each include a silicon nitride film.

7. The method for manufacturing a semiconductor integrated circuit device according to claim 6,
   wherein said first gate electrode and said second gate electrode consist of a polycrystalline silicon film, and said second gate insulating film consists of a three-layer film in which a silicon oxide film, a silicon nitride film and a silicon oxide film are laminated in this order.

8. The method for manufacturing a semiconductor integrated circuit device according to claim 7,
   wherein said first insulating film consists of a two-layer film in which a silicon oxide film and a silicon nitride film are laminated in this order, and said etching prevention film is formed to cover a sidewall portion of said two-layer film.

9. A method for manufacturing a semiconductor integrated circuit device, comprising the steps of:
   (a) forming, on a main surface of a semiconductor substrate, a first gate insulating film consisting of a silicon oxide film, and forming a first conductive film, a second gate insulating film and a second conductive film over said first gate insulating film in this order:
   (b) forming a first protection insulating film consisting of a single layer silicon oxide film formed over said second conductive film, with or without a laminating silicon nitride film formed over the silicon oxide film;
   (c) patterning said first protection insulating film, and thereby forming an etching mask consisting of said first protection insulating film;

(d) patterning said second conductive film, said second gate insulating film and said first conductive film in this order by dry etching using said etching mask as a mask, and thereby forming a plurality of gate electrodes that each have a floating gate electrode formed by a portion of said first conductive film and a control gate electrode formed by a portion of said second conductive film and that each have a laminated structure in which an upper portion of said control gate electrode is covered with said first protection insulating film;

(e) forming an etching prevention film consisting of a silicon nitride film on the patterned first protection insulating film, after said step (c) and before said step (d), or after said step (d), said etching prevention film being formed on both sidewall portions of the patterned first protection insulating film but so as not to cover sidewall portions of said floating gate electrode and said control gate electrode formed in said step (d);

(f) introducing impurities into the main surface of said semiconductor substrate located between sidewall portions facing each other in said plurality of gate electrodes, and thereby forming a source region and a drain region;

(g) treating a surface of said semiconductor substrate by using etchant containing a hydrofluoric acid after said step (f), and thereby cleaning said first gate insulating film located between the sidewall portions which face each other in said plurality of gate electrodes;

(h) covering an upper portion and both sidewall portions of each of said plurality of gate electrodes after said step (g), and forming a second protection insulating film consisting of a silicon nitride film having such a thickness as to partially embed a region between the sidewall portions which face each other in said plurality of gate electrodes;

(i) forming, on an upper portion of said second protection insulating film, an interlayer insulating film consisting of a silicon oxide film, and embedding, with said interlayer insulating film, the region between the sidewall portions which face each other in said plurality of gate electrodes;

(j) etching said interlayer insulating film and said second protection insulating film located between the sidewall portions which face each other in said plurality of gate electrodes, and thereby forming a first connection hole for exposing a surface of said source region and a second connection hole for exposing a surface of said drain region; and (k) forming a third conductive film electrically connected to said source region inside said first connection hole, and forming a fourth conductive film electrically connected to said drain region inside said second connection hole.

10. The method for manufacturing a semiconductor integrated circuit device according to claim 9,
wherein said third conductive film formed inside said first connection hole functions as a part of a source line, and said fourth conductive film formed inside said second connection hole functions as a part of a data line.

11. The method for manufacturing a semiconductor integrated circuit device according to claim 10,
wherein each of said plurality of gate electrodes constitutes part of a respective memory cell of a flash memory, and writing into said memory cell is carried out by injecting a charge into said floating gate electrode thereof, and erasing from said memory cell is carried out by discharging, to said semiconductor substrate, said charge injected into said floating gate electrode thereof.

12. The method for manufacturing a semiconductor integrated circuit device according to claim 7,
wherein said flash memory is an NOR type flash memory.

13. The method for manufacturing a semiconductor integrated circuit device according to claim 1,
wherein each of said at least one pair of laminated structure bodies constitutes a memory cell of a flash memory, and writing into said memory cell is carried out by injecting a charge into said floating gate electrode.

14. The method for manufacturing a semiconductor integrated circuit device according to claim 13,
wherein said flash memory is an NOR type flash memory.

15. The method for manufacturing a semiconductor integrated circuit device according to claim 9,
wherein said step (g) is conducted so that said first gate insulating film retreats beneath opposite sidewall portions of said floating gate electrode.

16. A method for manufacturing a semiconductor integrated circuit device having an MIS transistor structure of a flash memory, comprising the steps of:

(a) forming, on a main surface of a semiconductor substrate, a first gate insulating film, and forming a first conductive film, a second gate insulating film and a second conductive film over said first gate insulating film in this order;

(b) forming a first protection insulating film consisting of a single layer silicon oxide film formed over said second conductive film, with or without a laminating silicon nitride film formed over the silicon oxide film;

(c) patterning said first protection insulating film, and thereby forming an etching mask consisting of said first protection insulating film;

(d) patterning said second conductive film, said second gate insulating film and said first conductive film in this order by dry etching using said etching mask as a mask, and thereby forming a plurality of gate electrodes that each have a floating gate electrode formed by a portion of said first conductive film and a control gate electrode formed by a portion of said second conductive film and that each have a laminated structure in which an upper portion of said control gate electrode is covered with said first protection insulating film;

(e) forming an etching prevention film consisting of a silicon nitride film on the patterned first protection insulating film, after said step (c) and before said step (d), or after said step (d), said etching prevention film being formed on both sidewall portions of the patterned first protection insulating film but so as not to cover sidewall portions of said floating gate electrode and said control gate electrode formed in said step (d);

(f) introducing impurities into the main surface of said semiconductor substrate located between sidewall portions facing each other in said plurality of gate electrodes, and thereby forming a source region and a drain region;

(g) treating a surface of said semiconductor substrate by using etchant after said step (f);

(h) covering an upper portion and both sidewall portions of each of said plurality of gate electrodes after said step (g), and forming a second protection insulating film consisting of a silicon nitride film having such a thickness, as to partially embed a region between the sidewall portions which face each other in said plurality of gate electrodes;

(i) forming, on an upper portion of said second protection insulating film, an interlayer insulating film consisting of a silicon oxide film, and embedding, with said interlayer insulating film, the region between the sidewall portions which face each other in said plurality of gate electrodes;

(j) etching said interlayer insulating film and said second protection insulating film located between the sidewall portions which face each other in said plurality of gate electrodes, and thereby forming a first connection hole for exposing a surface of said source region and a second connection hole for exposing a surface of said drain region.

17. The method for manufacturing a semiconductor integrated circuit device according to claim 16, further comprising the steps of:

forming a third conductive film electrically connected to said source region inside said first connection hole, and forming a fourth conductive film electrically connected to said drain region inside said second connection hole.

18. The method for manufacturing a semiconductor integrated circuit device according to claim 17, wherein said third conductive film formed inside said first connection hole functions as a part of a source line, and said fourth conductive film formed inside said second connection hole functions as a part of a data line.

19. The method for manufacturing a semiconductor integrated circuit device according to claim 18, wherein each of said plurality of gate electrodes constitutes part of a respective memory cell of a flash memory, and writing into said memory cell is carried out by injecting a charge into said floating gate electrode thereof, and erasing from said memory cell is carried out by discharging, to said semiconductor substrate, said charge injected into said floating gate electrode thereof.

20. The method for manufacturing a semiconductor integrated circuit device according to claim 16, wherein said flash memory is a NOR type flash memory.

21. The method for manufacturing a semiconductor integrated circuit device according to claim 16, wherein said step (g) is conducted so that said first gate insulating film retreats beneath opposite sidewall portions of said floating gate electrode.

22. The method for manufacturing a semiconductor integrated circuit device according to claim 1, wherein said step (d) is conducted such that said first gate insulating film retreats beneath opposite sidewall portions of said first gate electrode.

* * * * *